(12) United States Patent
Croglio, Jr. et al.

(10) Patent No.: US 11,169,357 B2
(45) Date of Patent: Nov. 9, 2021

(54) LIGHT SOURCE MODULE

(71) Applicant: SpectraSensors, Inc., Rancho Cucamonga, CA (US)

(72) Inventors: Nicholas J. Croglio, Jr., Rancho Cucamonga, CA (US); Peter Scott, Rancho Cucamonga, CA (US); Doug Beyer, Rancho Cucamonga, CA (US); Kevin Ludlum, Rancho Cucamonga, CA (US); Keith Helbley, Rancho Cucamonga, CA (US); David Peter, Rancho Cucamonga, CA (US)

(73) Assignee: SpectraSensors, Inc., Rancho Cucamonga, CA (US)

( * ) Notice: Subject to any disclaimer, the term of this patent is extended or adjusted under 35 U.S.C. 154(b) by 141 days.

(21) Appl. No.: 16/281,841

(22) Filed: Feb. 21, 2019

(65) Prior Publication Data

US 2020/0271888 A1    Aug. 27, 2020

(51) Int. Cl.
*G02B 7/02* (2021.01)
*F21V 33/00* (2006.01)

(52) U.S. Cl.
CPC .......... *G02B 7/028* (2013.01); *F21V 33/0092* (2013.01); *G02B 7/025* (2013.01)

(58) Field of Classification Search
CPC . G02B 7/00; G02B 7/02; G02B 7/028; G02B 7/025; G02B 7/008; G02B 27/62; G02B 6/32; G02B 6/36; G02B 6/3616; G02B 6/322; H01S 5/022; H01S 5/068; H01S 5/024; H01S 5/06825; H01S 5/02415; H01S 5/02276; H01S 5/02212; H01S 5/02236; H01S 5/02248; H01S 3/04; F21V 33/00; F21V 33/0092
USPC ............... 359/820, 811, 821, 819, 703, 704; 372/34, 36, 38.1, 38.01
See application file for complete search history.

(56) References Cited

U.S. PATENT DOCUMENTS

| | | | |
|---|---|---|---|
| 5,615,052 A | 3/1997 | Doggett | |
| 6,961,496 B2 * | 11/2005 | Hellman | G02B 6/2937 385/33 |
| 2002/0110322 A1 | 8/2002 | Brun et al. | |
| 2005/0047731 A1 * | 3/2005 | Hu | G02B 6/4204 385/92 |
| 2007/0147745 A1 | 6/2007 | Fujimura | |

(Continued)

FOREIGN PATENT DOCUMENTS

WO    2017040622 A1    3/2017

*Primary Examiner* — Jie Lei
(74) *Attorney, Agent, or Firm* — Christopher R. Powers; Endress+Hauser (USA) Holding Inc.

(57) ABSTRACT

A light source module may include a base with a support feature protruding from a surface of the base and securing a light source to direct radiation away from the surface. A lens cells may be attached proximate to the surface, optionally by being secured within a sleeve that is attached at one end to the surface. A multi-conductor part may include electrical conductors and a base temperature sensor that contacts the base. The base temperature sensor may be electrically connected to at least one of the plurality of conductive elements and further connected to an optical ignition safety protection system configured to interrupt current to the light source if the base temperature sensor indicates that a temperature of the light source is outside of a safe range.

17 Claims, 17 Drawing Sheets

(56) References Cited

U.S. PATENT DOCUMENTS

2015/0171594 A1* 6/2015 Serbicki .............. H01S 5/02212
                                                    372/38.02
2016/0266034 A1* 9/2016 Helbley ................ G01J 1/4257
2016/0365700 A1    12/2016 Noguchi et al.

* cited by examiner

LIGHT SOURCE MODULE

TECHNICAL FIELD

The subject matter described herein relates to light source modules and the like, for example modules for housing, powering, controlling, etc. various components of a spectrometer, such as for example a light source and heater and/or cooler device (e.g., a thermal control device) under control of a temperature controller (e.g., logic implemented in software and/or hardware).

BACKGROUND

Existing spectrometer technology generally includes the use of complicated system configurations that may be difficult to operate and maintain under field conditions such as for use in remote sensing, process control, and the like. For example, in some applications that make use of spectrometer-based sensing, one or more of a variety of safety and/or usability features (e.g., reduced size and/or power consumption, better temperature control, reduced explosion risk, etc.) may be improved by reducing the size and thermal mass of a light source module that is connectable to a controller of a spectrometer system and that houses a light source, lens, and thermal control device.

SUMMARY

In one aspect of the present disclosure, a method for assembling a light source module includes positioning a multi-conductor part relative to a base to provide a plurality of electrical conductors, wherein the base includes a surface and a support feature protruding from the surface, the multi-conductor part including a plurality of electrical conductors and a base temperature sensor that contacts the base, the base temperature sensor being electrically connected to at least one of the plurality of electrical conductors. The method includes connecting a mounting plate to the support feature, the mounting plate having a light source attached thereto, the light source being oriented such that radiation emitted from the light source is directed away from the surface of the base, the light source including a semiconductor laser, and mounting a side of the base opposite the surface to a cold side of a heat or temperature control device, wherein an opposing hot side of the heat or temperature control device is mounted to a hot plate. The method further includes securing a lens cell proximate to the surface of the base, the lens cell having a lens attached therein, wherein the securing includes positioning and orienting the lens cell relative to the radiation emitted from the light source, and further connecting the at least one of the plurality of electrical conductors that is electrically connected to the base temperature sensor to an optical ignition safety protection system configured to interrupt current to the light source if the base temperature sensor indicates that a temperature of the light source is outside of a safe range.

In some variations of the method, one or more of the following can optionally be included in any feasible combination. In an embodiment, the base temperature sensor includes a plurality of base temperature sensors configured to provide signals to the optical ignition safety protection system, which is configured to interrupt current to the light source if any of the signals from the plurality of base temperature sensors indicate that the temperature of the light source is outside of the safe range. In another embodiment, the lens cell is rotationally symmetric about a lens cell axis.

In a further embodiment, the securing of the lens cell proximate to the surface of the base includes attaching a sleeve that at least partially surrounds at least part of the lens cell to the surface of the base at a first end of the sleeve, and further positioning and holding the lens cell within the sleeve at a focal distance from the base as to provide a desired focal length of the radiation from the light source to the lens. In such an embodiment, the positioning and holding of the lens cells within the sleeve at the focal distance from the base includes using an adhesive that cures by either or both of radiation and/or heat, wherein the adhesive is applied between an outer surface of the lens cell and an inner surface of the sleeve and also between the first end of the sleeve and the surface of the base. In such an embodiment, the method may further include translating the combination of the lens cell and the sleeve relative to the base to achieve a desired alignment of the lens of the lens cell and the base in the x- and y-dimensions, where the x- and y-dimensions are parallel to an upper surface of the base, and performing an extension or retraction of the lens cell relative to the sleeve as to locate the lens at a position in the z-dimension, which is perpendicular to the x- and y-dimensions, at the focal distance from the light source. In such an embodiment, the method may further include checking the focal distance, wherein the checking includes causing radiation to be emitted by the light source and testing focus of the radiation to determine a preferred location for the lens cell and lens relative to the sleeve and the light source. In such an embodiment, the method may further include first curing the adhesive, the first curing including passing curing radiation through at least part of the sleeve, which includes a material that is transmissive to the curing radiation, and later second curing the adhesive by another technique.

In a further embodiment, the hot plate includes one or more mechanical joining and registration features, and the securing of the lens cell proximate to the surface of the base further includes establishing a beam angle, a polarity and a position of the radiation emitted from the light source within a set of tolerances relative to the mechanical joining and registration features. In another embodiment, the connecting of the mounting plate to the support feature includes making electrical connections between the electrical conductors in the multi-conductor part and conductive elements on the mounting plate, wherein the mounting plate and the multi-conductor part join at an approximately right angle.

In another aspect of the present disclosure, a light source module includes a base including a thermally conducting material and having a surface, a support feature thermally connected to the base and protruding from the surface, and a mounting plate attached to the support feature, the mounting plate having attached thereto a light source, the light source being aligned on the mounting plate as attached to the support structure to direct radiation along a radiation axis directed away from the surface of the base, the light source including a semiconductor laser. The light source module includes a lens cell having a rotationally symmetric shape and a lens support upon which a lens is supported, the lens cell secured in a lens cell position proximate the surface of the base such that the radiation axis passes through the lens supported on the lens support and a sleeve at least partially encircling the lens cell, the sleeve having an end that contacts and is secure to the surface of the base, wherein the sleeve is secured to the lens cell such that an outer surface of the lens cell is secured to an inner surface of the sleeve. The light source module further includes a multi-conductor part including a plurality of electrical conductors that provide a plurality of electrical connections to a plurality of conductive elements on the mounting plate, the multi-conductor part further including a base temperature sensor configured to provide signals to an optical ignition safety protection system configured to interrupt current to the light source when the signals from the base temperature sensor indicate that a temperature of the light source is outside of a safe range.

In some variations of the light source module, one or more of the following can optionally be included in any feasible combination. In an embodiment, the base temperature sensor includes a plurality of base temperature sensors configured to provide signals to the optical ignition safety protection system, which is configured to interrupt current to the light source when any of the signals from the one or more base temperature sensors indicate that the temperature of the light source is outside of the safe range. In another embodiment, the mounting plate and the multi-conductor part join at an approximately right angle. In yet another embodiment, the lens cell is rotationally symmetric about a lens cell axis.

In an embodiment, the lens cell is secured proximate to the surface of the base within the sleeve, and wherein the lens cell is positioned and held within the sleeve at a focal distance from the base as to provide a desired focal length of the radiation from the light source to the lens. In such an embodiment, the lens cell is secured within the sleeve by an adhesive that cures by either or both of radiation and/or heat, wherein the adhesive is applied between an outer surface of the lens cell and an inner surface of the sleeve and also between an end of the sleeve and the surface of the base. In such an embodiment, the sleeve includes a material that is transmissive to curing radiation used in curing the adhesive.

In another embodiment, the light source module further includes a heat or temperature control device having a cold side in thermal communication with a side of the base opposite to the surface. In such an embodiment, an opposing hot side of the heat or temperature control device is mounted to a hot plate. In such an embodiment, the hot plate includes one or more mechanical joining and registration features, and wherein the securing of the lens cell proximate to the surface of the base further comprises establishing a beam angle, a polarity and a position of the radiation emitted from the light source within a set of tolerances relative to the mechanical joining and registration features.

The details of one or more variations of the subject matter described herein are set forth in the accompanying drawings and the description below. Other features and advantages of the subject matter described herein will be apparent from the description and drawings, and from the claims.

BRIEF DESCRIPTION OF THE DRAWINGS

The accompanying drawings, which are incorporated in and constitute a part of this specification, show certain aspects of the subject matter disclosed herein and, together with the description, help explain some of the principles associated with the disclosed implementations. In the drawings.

When practical, similar reference numbers denote similar structures, features, or elements.

DETAILED DESCRIPTION

Figure 1:
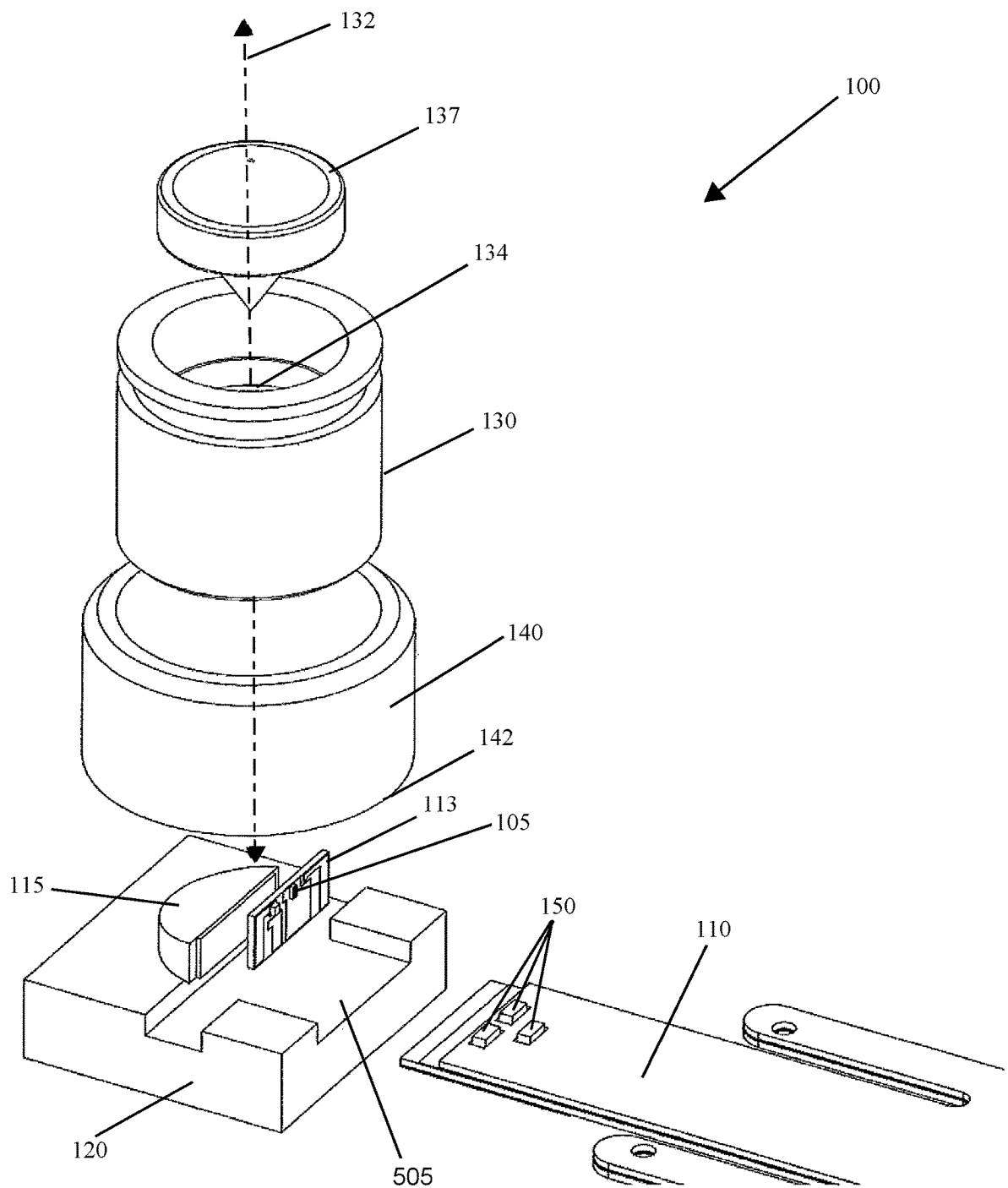
FIG. 1 shows an exploded view illustrating features of an example light source module consistent with implementations of the current subject matter.

Currently available light source modules may be improved by various approaches consistent with the disclosure provided herein. Example advantages, one or more of which may result from use of the current subject matter, can include reduced power consumption, reduced volume and/or mass of a light source module, greater ease of alignment of optical components and sighting of the laser bore during assembly, intrinsic safety of the various electric and/or optical components, increased accuracy of laser temperature control, improved modularity (e.g., more efficient production of light source modules that may be conveniently installed in a compatible spectrometer system without a need for complicated alignment or calibration procedures), and possibly others.

With regards to intrinsic safety, both electrical and optical power delivered to zones where potentially explosive conditions (e.g., gas mixtures with one or more flammable components present above an ignition threshold) may be present can be readily controlled using features consistent with one or more implementations of the current subject matter. Intrinsic safety can allow safe usage of a spectrometer incorporating a light source module consistent with the current subject matter with explosive gas mixtures without requiring compliance with typical heightened explosion protection level measures, such as special enclosures or other explosion protection measures such as those of type o, q, m, p, e, d, i, n, etc. to achieve safety mandated at one or more of Zone 2, 1, 0 or Division 2, 1, etc. Details of the different levels of explosion protection classifications are beyond the scope of this disclosure but are known to those skilled in the art. Various online sources, such as for example CSA Group (see the "Guide to Equipment Certification Requirements for Hazardous Locations" available at https://www.csagroupuk.org/wp-content/uploads/2015/03/160155-CSA-HAZ-WALL-CHART-V3-INTER-LO.pdf) provide listings of these standards.

Intrinsic safety can also provide advantages related to optical ignition protection, which refers generally to measures consistent with preventing or limiting the possibility that emitted radiation will produce a source of ignition, for example due to accumulation of energy sufficient to cause ignition of a potentially explosive gas mixture via absorption of radiation by one or more gases in the gas mixture or initiation of a photochemical process capable of causing ignition, via absorption of laser energy by solid surfaces and/or particles in or in contact with the gas mixture, and/or via formation of a plasma and/or initiation of a reaction at an absorber surface).

As noted above, various aspects of a light source module consistent with one or more implementations of the current subject matter may enable significant reductions in size of a light source module relative to previously available approaches. In some examples, this reduced size and mass may allow the use of a thermo-electric cooler device of sufficiently small size and mass as to not require use of epoxy or other filler or structural reinforcement to provide necessary rigidity. Omission of the epoxy and or filler material can provide advantages in improved electrical to thermal conversion efficiency. Additionally, a reduction of the thermal mass needing to be maintained at an operating temperature may also provide benefits in regards to improved thermal control of the light source module. For example, in spectrometer applications in which very precise wavelength control is needed, an ability to quickly and precisely control the temperature of the light source may be desirable, particularly for semiconductor lasers whose emission wavelength, power, and/or other parameters may be quite sensitive to temperature.

Miniaturization of a light source module for a spectrometer is generally not effectively accomplished merely by making all of the components smaller. Various considerations, including arrangement of the light source and where the beam is directed, thermal expansion effects on beam and optical component alignment, robustness of the overall structure, thermal conductivity of mechanical interfaces, adhesive methods and melting and cure temperatures (e.g., bond methods, thicknesses, conduction, and flexibility), wiring and electrical thermal conductivity, ambient heat transfer, stray light, beam forming, electrical isolation clearances, electrical segregation, airgap and solid insulation methods, signal integrity, material selection (e.g., for compatibility, thermal transfer, cost, machining and assembly), thermoelectric operating mode, system thermal response and stability control, tolerance stackup of sub components and range of adjustment in assembly, maximum optical power, maximum voltage requirement, and the like need to be taken into account. The current subject matter may address such issues via incorporation of one or more of the features described in detail below.

Other advantages may be provided by implementations of the current subject matter. For example, assembly of a light source module may be simplified by use of a novel arrangement of components in conjunction with assembly methods that avoid the use of screws or mechanical attachments in favor of rapidly curable adhesives such that assembled components may be precisely and reproducibly positioned and then held in place without the need for mechanical attachments. Avoidance of mechanical attachments may provide a variety of advantages, such as for example avoidance of mechanical stresses (and potential distortions or mechanical defects that may result therefrom) from unbalanced tightening of opposed screws, difficulty in assembly due to very small mechanical parts, and the like. Additionally or alternatively, permanent assembly through adhesives and soldering may significantly improve vibration tolerance and increase the service life of the module. Precision positioning (e.g., of a lens cell 130 and a sleeve 140 relative to each other and to a base 120, each described in further detail herein) through a curing process may provide a smaller and more deterministic shift during cure and affixing than equivalent mechanical methods, thereby simplifying assembly and increasing first pass yield.

Also as alluded to above, additional benefits potentially associated with implementations of the current subject matter include the ability to modularize a light source module such that manufacture, calibration, optical alignment, etc. of the light source module may be performed independent of construction and assembly of other components of a spectrometer system. In an example of this feature of the current subject matter, in at least some implementations a light source module may include one or more registration features to which relative alignment and positioning of a light source, lens, etc. can be fixed and which can be used to reproducibly fix the light source module into a spectrometer system. In this manner, a light source module may be assembled such that the various components are oriented and/or aligned relative to one or more registration features or elements of the light source module. The one or more registration features or elements of the light source module can in turn be used to establish and/or maintain a reproducible orientation and/or alignment of the light source module with other components of a spectrometer into which the light source module is installed. Accordingly, consistent with some implementations of the current subject matter, one light source module may be exchanged into a single spectrometer device to replace another light source module, optionally without requiring further factory calibration, while performing comparably with a suitably similar beam alignment and orientation. This feature can be highly useful for enhancing the amount of time an instrument can remain "in service" because removal from active use for calibration and alignment is not required to replace a light source.

In general, a light source module consistent with implementations of the current subject matter includes a light source (e.g., a laser, optionally a semiconductor laser), a support feature upon which the light source is supported or to which the light source is connected, a lens, and electrical conductors for providing power and/or carrying control signals to and/or from light source module components. In some examples, one or more of advantages of the current subject matter (e.g., those discussed herein or others) may be realized by inclusion of features such as those illustrated in the light source module 100 illustrated in and described below in relation to FIG. 1, FIG. 2, and FIG. 3, which respectively show an exploded view, a cutaway/cross-sectional view, and a fully assembled isometric view illustrating features of an example light source module 100 consistent with some implementations of the current subject matter. The light source module 100 includes a light source 105, which in an exemplary implementation may include a semiconductor laser chip. Other light sources are contemplated as well.

Power and control circuits serving the light source 105 may be connected to a controller (not shown in FIG. 1, FIG. 2, or FIG. 3), which may be a programmable processor, an integrated circuit, a microcontroller, circuitry that implements one or more logic gates, or the like via a multi-conductor part 110. In some implementations of the current subject matter, the multi-conductor part 110 may be a ribbon connector, such as for example a ribbon cable having multiple conductors joined together to form a flat or other-shaped grouping, or the like. In other example implementations consistent with the current subject matter, the multi-conductor part 110 may be or include discrete wiring (e.g., separate conductive elements that are not bound together into connected groupings of wires or conductors or that are included in more than one discrete bundle having one or more conductive elements), a flex cable, a printed circuit board having multiple conductive traces thereupon, or the like. The light source 105 may be attached to a mounting plate 113, which in turn is attached to a support feature 115 that is part of and/or connected to a base 120 of the light source module 100. The base 120 may also be referred to as a cold plate, for example in implementations of the current subject matter in which the base 120 is mounted to a cold side of a temperature control device such as a thermoelectric cooler (TEC) as described further herein. The multi-conductor part 110 may include leads for powering and/or controlling the light source 105, for receiving signals from one or more temperature sensors, for powering a temperature control device, and/or other functions, optionally including those discussed herein. Such one or more temperature sensors may be positioned to monitor a temperature of the light source module 100 (e.g., via detection of temperature of the base 120, the support feature 115, the mounting plate 113, or other desirable location) and/or a temperature of a temperature control device and/or other components of the light source module 100.

Figure 3:
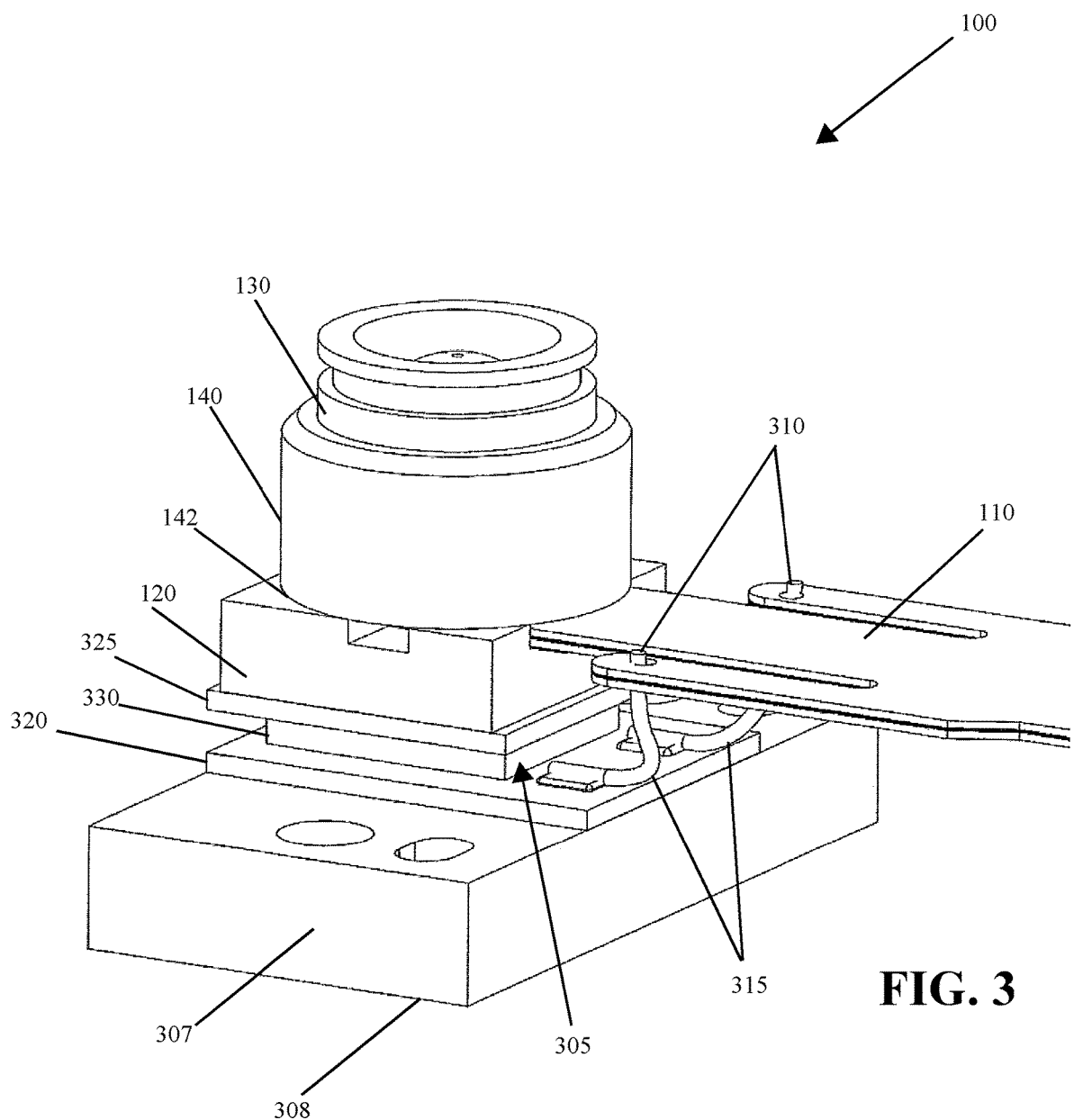
FIG. 3 shows a side elevation view of the example light source module consistent with implementations of the current subject matter mounted to other spectrometer components.

In some implementations of the current subject matter, the mounting plate 113 may be a heat spreader, which may be formed of a material with high thermal conductivity but low electrical conductivity (e.g., the mounting plate 113 may preferably be an electrical insulator). The mounting plate 113 may also include one or more conductive traces or other conductive features deposited thereon and/or attached thereto. The support feature 115 can advantageously be a heat spreader or other feature having good thermal transfer properties. The mounting plate 113 with the light source 105 and associated conductive traces can be mounted onto the support feature 115, for example to enable good thermal contact between the mounting plate 113 and the support feature 115. As shown in FIG. 3, a temperature or heat control device 305, which can be a thermo-electric cooler or other heat removal/addition device or temperature control unit may be in thermal contact with the support feature 115, for example via thermal conduction through the base 120 to which the support feature 115 is attached or of which the support feature 115 is an integral part. An opposite side of the temperature or heat control device 305 may be mounted to or otherwise in physical and thermal contact with a hot plate 307.

The multi-conductor part 110 may include one or more conductors for providing current to the light source 105 and/or the temperature or heat control device 305 (as discussed further herein) and for controlling and/or receiving data from one or more temperature sensor(s). The multi-conductor part 110 may optionally include a data connection via which data from a memory component mounted on or otherwise connected to or associated with the light source module 100 may be read by a processor of a spectrometer system into which the light source module is incorporated. Various example features consistent with this implementation of the current subject matter are discussed in more detail below. The one or more temperature sensors can, in implementations of the current subject matter, be or include a thermocouple, a thermistor, or some other device useful for determining, monitoring, and/or controlling a temperature of the light source 105, the base 120, the support feature 115, the mounting plate 113, or the like. As discussed below, one or more light source temperature sensors 145 can be included on the mounting plate 113 or otherwise be disposed in sufficient thermal coupling to the light source 105 to allow for accurate measurement of a temperature of the light source 105. Such temperature measurements can be advantageous for maintaining accurate and precise control of the power and wavelength output from the light source 105, in particular for the example in which the light source 105 is a semiconductor laser. Semiconductor lasers and other light sources can have quite high sensitivity to temperature for both in wavelength and optical power output. For spectroscopic measurements requiring accurate and reproducible readings of optical absorption, refraction, reflection, etc., an ability to accurately and precisely monitor and tightly control output parameters of the light source 105 may be desirable.

Furthermore, in some implementations of the current subject matter, one or more additional base temperature sensors 150 may be included on or otherwise coupled or attached to the multi-conductor part 110 or to electrical leads within the multi-conductor part 110. The additional base temperature sensors 150 may be part of an optical ignition safety protection system. The optical power conversion efficiency (e.g., the optical energy output for a given electrical driving current) of some light sources (e.g., semiconductor lasers and the like) increases as temperature decreases. As such, it can be advantageous for a light source module to include safety systems that constrain or completely prevent the possibility of current being supplied to the light source 105 when a temperature of the light source 105 is outside a predetermined temperature range (or optionally below a predetermined threshold temperature) such that a maximum possible optical power output of the light source 105 is limited to be less than a sufficiently safe level, for example including optical ignition safety (OPIS) requirements. In other words, a light source module 100 consistent with implementations of the current subject matter can include features of a safety system configured to prevent delivery of a potentially hazardous level of optical energy to a part of a spectrometer system capable of containing an explosive mixture (e.g. one or more flammable or explosive compounds present in the gas phase above a lower explosive limit, or alternatively above some safety factor below the lower explosive limit).

In one example, the multi-conductor part 110 may include and/or connect to one or more base temperature sensors 150 (e.g., thermistors, thermocouples, or the like) that are configured to thermally contact the base 120 and thereby provide, via one or more conductors in the multi-conductor part 110, signals indicative of a temperature of the base 120 of the light source module 100 and/or the support structure 115 that is part of or otherwise thermally connected to the base 120. As the base 120 is advantageously formed of a good thermal conductor and is in direct thermal contact (at least via the support feature 115) with the mounting plate 113 to which the light source 105 is connected, the temperature signals produced by the one or more base temperature sensors 150 are at least approximate to and generally representative of a current temperature of the light source 105. A controller configured to operate the light source module 100, and/or optional safety circuitry separate from the controller, may be configured to interrupt or otherwise prevent delivery of a driving current to the light source 105 if the temperature signals produced by the one or more base temperature sensors 150 indicate that the base 120 (and therefore the light source 105) is below a predetermined temperature threshold. In certain implementations of the current subject matter, circuitry that interrupts or otherwise prevents delivery of driving current to the light source 105 can be completely independent of software. In other words, the current interrupt can be purely a hardware logic function such that a switch or series of switches (e.g., on an integrated circuit) is opened to prevent current flow to the light source 105 unless the base temperature sensors 150 all provide signals within a range that indicates a safe operating temperature for the light source 105.

The foregoing approach to limiting the ability of a system to provide driving current to a light source 105 when it is determined that the light source 105 may be below a threshold temperature can be advantageous in designing a light source module 100 that has intrinsic safety and/or OPIS features. Such features can include limitations on amounts of electrical, thermal, and/or optical energy that can be delivered to a "hazardous" part of a spectrometer system such that the hazardous part need not include explosion protection structures such as reinforced sample cell walls, explosion-proof enclosures, particulate filters and protection, etc. Other features of the current subject matter may also provide benefits with regards to electrical and thermal safety as discussed herein.

Furthermore, an approach of thermally limiting the light source 105 of a spectrometer to within a specified range (e.g., no lower than a threshold temperature) within which it is impossible to exceed a maximum optical power limit can avoid a requirement that the light source module 100 or a spectrometer system into which the light source module 100 is installed include a particle filter and/or other features necessary to ensure that sufficient laser energy to create an ignition source is not allowed to be focused onto a surface or particle within the light source module 100.

Referring again to FIG. 1 through FIG. 3, the light source 105 may advantageously be oriented such that radiation 125 (e.g., light that may be visible, infrared, ultraviolet, or in other parts of the electromagnetic spectrum) emitted by the light source 105 is projected into a lens cell 130, which houses and/or supports a lens 137 that may be used to collimate, focus, direct, etc. the radiation emitted by the light source 105. The lens cell 130 and the light source 105 may be oriented such that a radiation axis along which the radiation 125 is emitted by the light source 105 is at least approximately aligned with a lens cell axis 132 of the lens cell 130 to provide a beam of radiation from the light source 105 through the lens 137 such that the radiation 125 is directed at least approximately orthogonally to a flat, opposed mating surface of the light source module 100. In this context, the "opposed mating surface" is arranged at an opposite end of the light source module 100 from where the lens 137 is positioned and faces opposite of a direction toward which the radiation 125 exiting the lens cell 130 is directed. The opposed mating surface may be configured to be physically joined to a compatible structure of a spectrometer system in which the light source module 100 is employed. For example, the opposed mating surface 308 may be a side of a hot plate 307 to which the temperature or heat control device 305 (e.g. a thermoelectric cooler) is attached. Such an arrangement is described in more detail herein.

Furthermore, the light source 105, the lens cell 130, including the lens 137 held in the lens cell 130, can advantageously be positioned relative to one or more registration features or marks on a part of the light source module 100 that is fixed in position relative to the flat, opposed mating surface 308 of the light source module 100. In other words, in some implementations of the current subject matter, the light source 105 and lens cell 130 (and its associated lens 137) may be aligned to provide the radiation 125 in a beam that is projected substantially orthogonally to the opposed mating surface 308 and with the light source 105 positioned at a well-characterized location relative to the opposed mating surface 308 and/or one or more mechanical reference features that ensure reproducible installation of the light source module 100 in a desired position and alignment within a spectrometer.

In the example of FIG. 1, which includes a cylindrical lens cell 130, the lens cell axis 132 may be an axis of rotational symmetry of the lens cell 130, and the main axis of radiation emission (i.e. the radiation axis) from the light source 105 may be at least approximately aligned with this lens cell axis 132. The lens cell 130 includes a lens support 134 upon which a lens 137 is supported when the light source module 100 is assembled. The lens support 134 may optionally include a focusing mechanism capable of translating the lens 137 along the lens cell axis 132. In other implementations of the current subject matter, the lens support 134 may support the lens 137 in a fixed position relative to the lens support 134. In some optional variations, the lens cell 130 and/or the lens 137 may include additional features that may be useful in fine tuning aspects of a optical path over which the emitted radiation 125 travels. Such additional features may include one or more of diffusers, apertures, coatings, or the like.

Different lens cell shapes are also contemplated by the current subject matter, though a cylindrical lens cell 130 may provide certain advantages. For example, a cylindrical lens cell 130 may generally have symmetrical thermal expansion characteristics in the radial direction (i.e., perpendicular to the lens cell axis 132 and the axis along which the radiation 125 is emitted by the light source 105). Thermal expansion of the lens cell 130 as a result of temperature changes may therefore affect only the relative distances of the physical components along a single axis (i.e., an axis parallel to the lens cell axis 132. Such changes would not cause a loss of alignment but instead merely cause a slight change in focus. This change in focus may be compensated for in some implementations of the current subject matter by a vertical adjustment via a focusing mechanism as discussed above. Alternatively, assembly of the light source module 100 may be performed at a temperature at or at least near a target operating temperature of the light source module 100 such that the lens cell 130 is installed with the lens 137 supported on the lens support 134 disposed a target distance from the light source 105, when the target distance is chosen to provide a desired level of focus of the radiation 125 emitted from the light source 105. Advantages of the cylindrical shape of the lens cell 130 and the orientation of the radiation 125 from the light source along the lens cell axis 132 of the lens cell 130 include the result that expansion and/or contraction of the cylindrical structure of the lens cell 130 in the axial direction does not generally affect alignment or other functioning of the light source module 100 with regard to directing the beam as such physical changes are expected to be axially symmetric.

Figure 2:
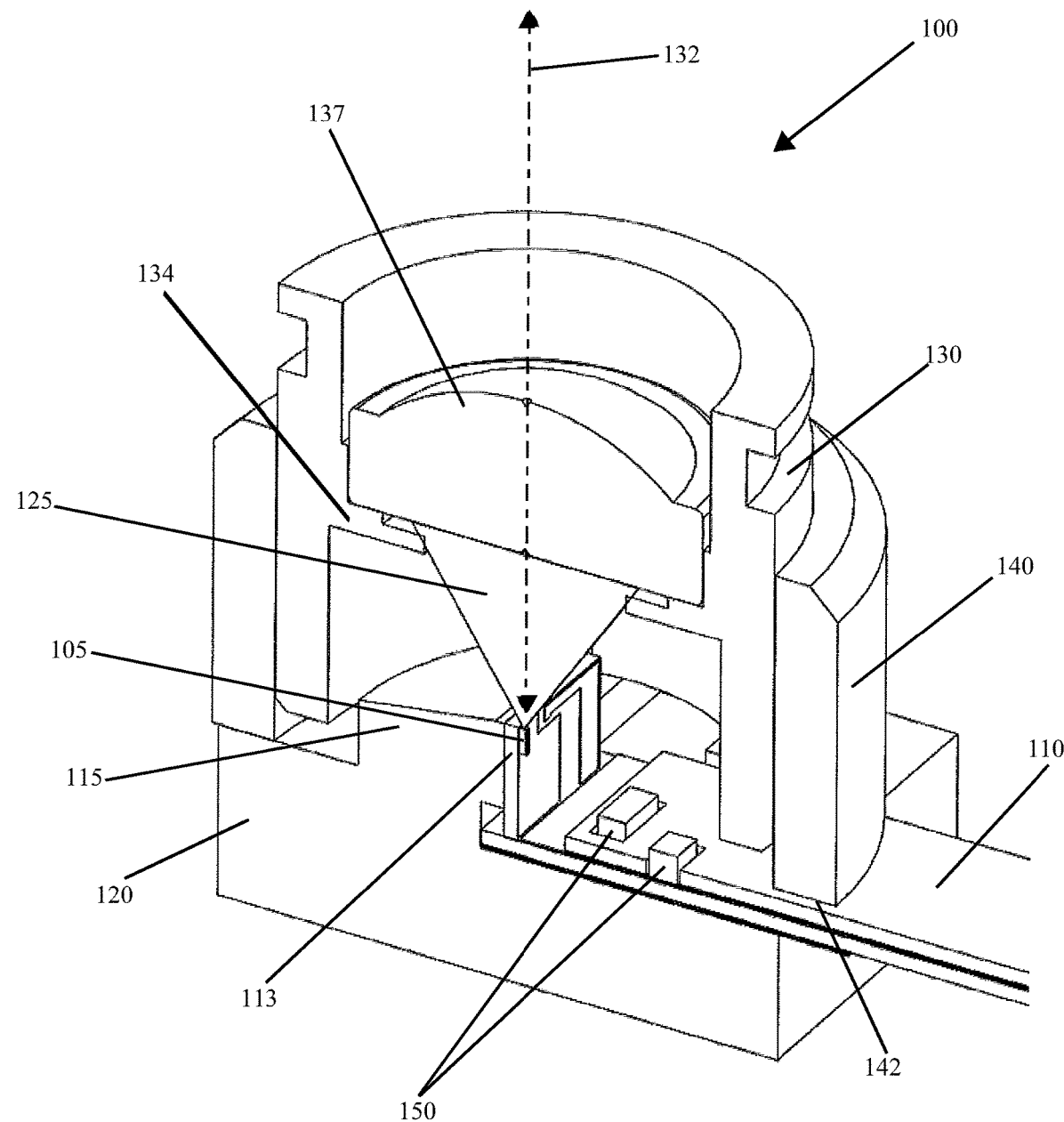
FIG. 2 shows a cutaway view illustrating features of the example light source module consistent with implementations of the current subject matter.

As further shown in FIG. 1 through FIG. 3, a sleeve 140 may enclose at least part of the lens cell 130. In some implementations of the current subject matter, the sleeve 140 can be formed of glass or some other comparable material having thermal and/or electrical insulating properties. In a cylindrical configuration of the light source module 100, the sleeve 140 may have a cylindrical shape that surrounds the lens cell 130. The sleeve 140 may desirably have a coefficient of thermal expansion that is at least approximately comparable to that of the lens cell 130 such that heating or cooling of the light source module 100 over large temperature ranges does not induce excess strain on either of the lens cell 130 or the sleeve 140.

The sleeve 140 may, consistent with some implementations of the current subject matter, be formed of or include a part that is transparent to at least certain types of radiation. In some implementations of the current subject matter, advantages of a sleeve 140 being transparent to or at least partially transmissive of ultraviolet (UV) radiation or some other type of radiation capable of assisting in fast curing of an adhesive material can be realized in improved ease of assembly of a spectrometer cell as described herein. For example, a UV-curing adhesive or other adhesives that may quickly be at least partially cured under application of radiation, heat, cold, etc. may be applied to the sleeve at a first end 142 of the sleeve 140, where the first end 142 contacts the base 120 when the light source module 100 is assembled. In implementations of the current subject matter in which the sleeve 140 is constructed of a material that is transmissive to UV radiation, following a joining of the first end 142 to the base 120, a UV-curing adhesive at the joint between these two features may be rapidly cured (at least partially) via delivery of UV radiation to the adhesive. A non-limiting example of a UV-curing adhesive that may be used in practicing the described subject matter is a cyanoacrylate glue, with low outgassing and having curing shrinkage and thermal expansion parameters that are at least approximately matched to the sleeve 140 and the lens cell 130. Such an adhesive may advantageously by curable by UV light and/or heat. Other adhesives may be used in conjunction with the current subject matter.

The transmissivity of the sleeve 140 may allow the applied UV radiation to more efficiently cure the bulk of the applied adhesive than if the sleeve 140 were absorptive (e.g., non-transmissive). A non-transmissive sleeve 140 would likely allow radiation-aided curing only around an outer perimeter of the sleeve 140. An ability to rapidly lock the sleeve 140 and the base 120 in position during assembly can be quite desirable for ensuring accurate and precise arrangement and alignment of the sleeve 140 on the base 120 in that the sleeve 140 may be brought to the correct position relative to the base 120 and then the two parts may be rapidly and securely joined without needing other means for holding them in position and without an immediate need to heat cure the adhesive. Subsequent heat curing of the adhesive may be desirable to form a stronger bond through a complete cure. However, having the parts locked in relative position by an at least partial radiation-aided cure may provide advantages in limiting possible thermal expansion issues during the heat curing process that may affect relative positioning if the parts are not already relatively secured by the initial radiation cure.

The transmissivity of the sleeve 140 to radiation may also be of further advantage in securing the lens cell 130 within the sleeve 140. As shown in FIG. 1 to FIG. 3, the lens cell 130 fits within the sleeve 140 and is supported at a position where it does not directly contact the base 120. One assembly technique consistent with the current subject matter includes securing the sleeve 140 to the base 120 at the first end 142 of the sleeve 140 and then inserting into the attached sleeve 140 the lens cell 130 with a lens 137 already secured to the lens support 134. This may be particularly advantageous approach for implementations in which the lens support 134 and lens cell 130 do not include an adjustment mechanism for translating the lens 137 along the lens cell axis 132. A radiation curing adhesive (optionally similar to what is described above for securing the sleeve 140 to the base 120) may be applied to at least part of the exterior surface of the lens cell 130 and/or at least part of the interior surface of the sleeve 140 before the lens cell 130 is inserted into the sleeve 140.

Once the lens cell 130 is properly positioned such that the lens 137 supported on the lens support 134 is at a desired focal distance, the lens cell 130 can be held at the desired position relative to the assembly of the sleeve 140 and the base 120 and the adhesive between the exterior surface of the lens cell 130 and the interior surface of the sleeve 140 may be at least partially cured by exposure of the assembly to radiation (e.g., UV radiation), which may pass through the transmissive material of the sleeve 140 to efficiently cause curing of the adhesive in a manner that would be difficult without the sleeve being made of a transparent and/or transmissive material.

Alternatively, the lens cell 130 having the lens 137 already mounted therein can be positioned within the sleeve 140 with adhesive applied between the outer surface of the lens cell 130 and the inner surface of the sleeve 140 and also to the end 142 of the sleeve but not yet cured. This sub-assembly may be translated to a desired position relative to the base 120 and light source 105 on the mounting plate 113 attached to the support feature 115, and the lens cells 130 may be extended relative to the sleeve 140 to provide the desired focal length relative to the light source 105 position with the end 142 of the sleeve 140 positioned against the base 120. The positioning and focal extension may be checked before radiation-aided curing of the adhesive. In this example, the adhesive between the end 142 of the sleeve 140 and the base 120 may be cured via exposure to UV or other appropriate-wavelength radiation concurrently with the adhesive between the outer surface of the lens cell 130 and the inner surface of the sleeve 140.

As with the bond between the first end 142 of the sleeve 140 and the base 120, full curing of the adhesive securing the lens cell 130 at a desired position within the sleeve may be achieved by a thermal curing process subsequent to the UV or other radiation-aided initial curing. In some examples, UV or other radiation-aided curing of a first adhesive bond between the first end 142 of the sleeve 140 and the base 120 can be followed by UV or other radiation-aided curing of a second adhesive bond between the inner surface of the sleeve 140 and the outer surface of the lens cell and then the partially cured assembly (the base 120 adhered to the first end 142 of the sleeve 140, and the lens cell 130 adhered within the sleeve 140, with the lens 137 also attached to the lens support 134 within the lens cell 130) can be heated to completed a thermal cure of the adhesive.

Figure 4:
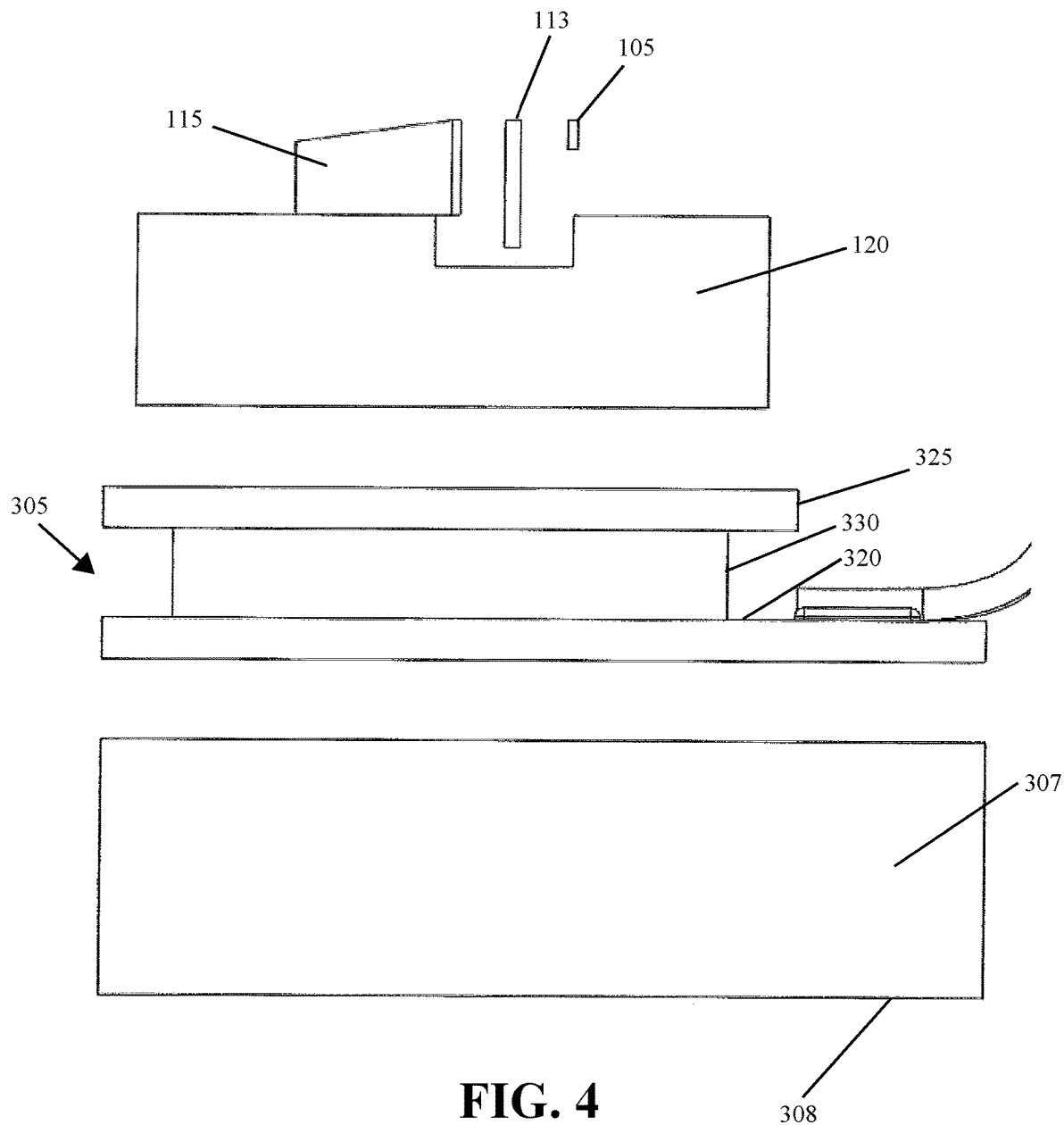
FIG. 4 shows a side cross-sectional view of part of an example spectrometer consistent with implementations of the current subject matter mounted to other spectrometer components.

FIG. 3 shows additional optional details of the of the multi-conductor part 110, which can include two leads 310 for providing current and/or control signals to the temperature or heat control device 305. FIG. 4 shows a cross-sectional side view (in a plane oriented along a direction in which the multi-conductor part 110 is aligned for joining to the base 120). The view of FIG. 3 illustrates the two leads 310 connected by lead wires 315 of an example of a thermoelectric cooler, which, as shown in both FIG. 3 and FIG. 4, includes a hot side 320 and a cold side 325 separated by a heat transfer layer 330. In some examples of a thermoelectric cooler, a series of Peltier junctions induce heat flow when energized via current supplied from the leads 310. The cold side 325 of the temperature or heat control device 305 can be in thermal contact with the base 120, which as noted above can advantageously have good thermal conductivity such that the temperature at which it is held by contact with the cold side 325 is well-distributed to other parts of the light source module 100. The hot side 320 can be in contact with a hot plate 307, which can act as a heat sink or can otherwise transfer heat to other parts of a spectrometer system. As mentioned above, the hot plate 307 can include an opposed mating surface 308, which is disposed orthogonally to an orientation of the beam of radiation 125 from the light source 105. The opposed mating surface 308 can be configured to mechanically join to a receiving part of a spectrometer. To assist with reproducible alignment of the light source 105 and beam of radiation 125, the opposed mating surface 308 may optionally include one or more registration features that couple to corresponding features on the spectrometer.

Figure 5:
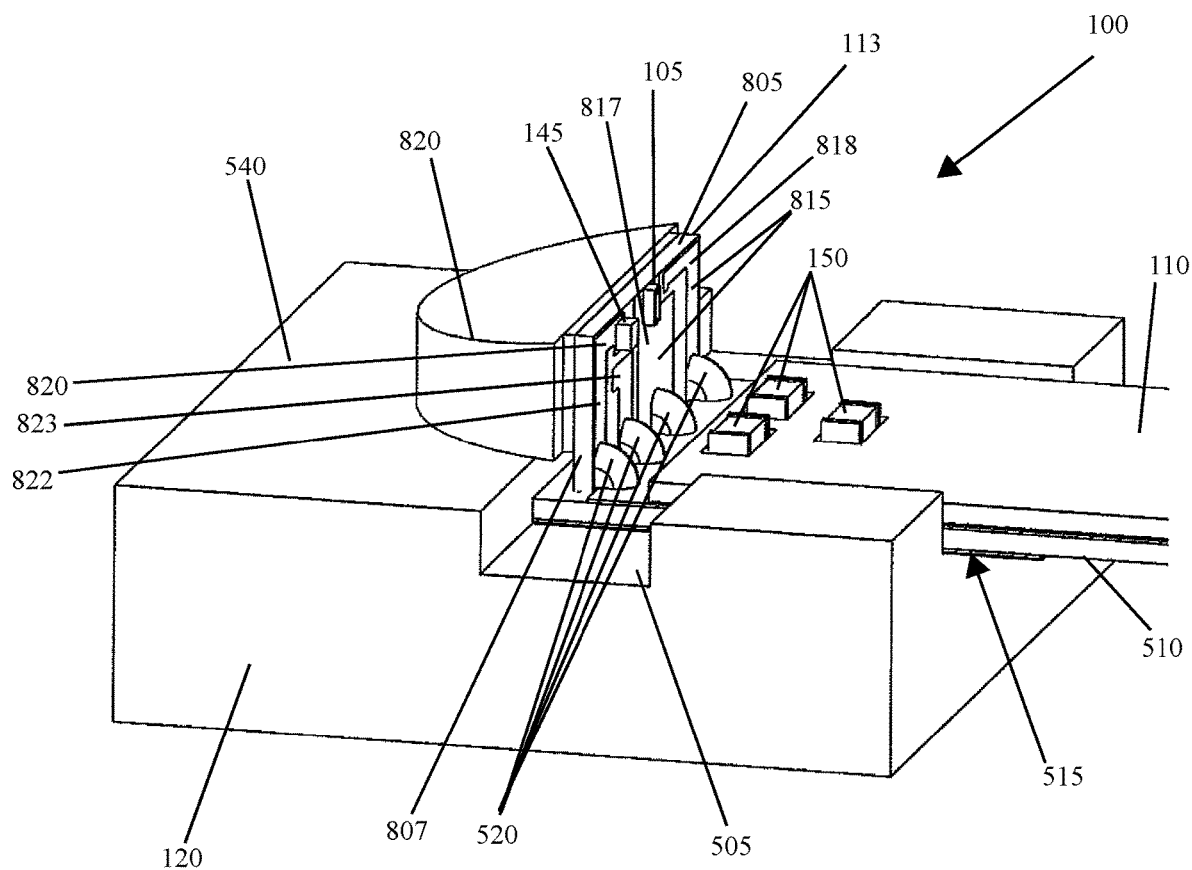
FIG. 5 shows a detail view of example connections between a multi-conductor part and a mounting plate among other features consistent with implementations of the current subject matter.
Figure 6:
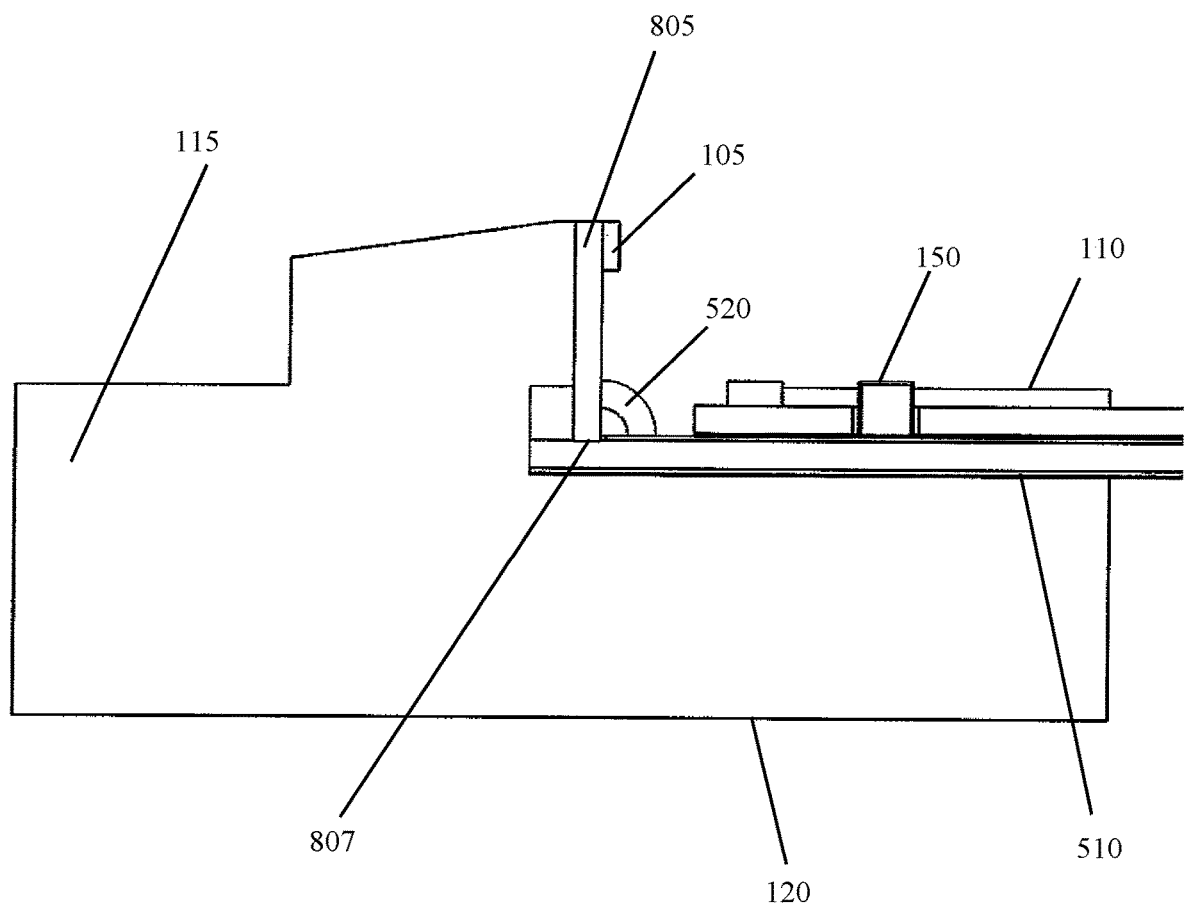
FIG. 6 shows a side detail cross sectional view of example connections between a multi-conductor part and a mounting plate among other features consistent with implementations of the current subject matter.
Figure 7:
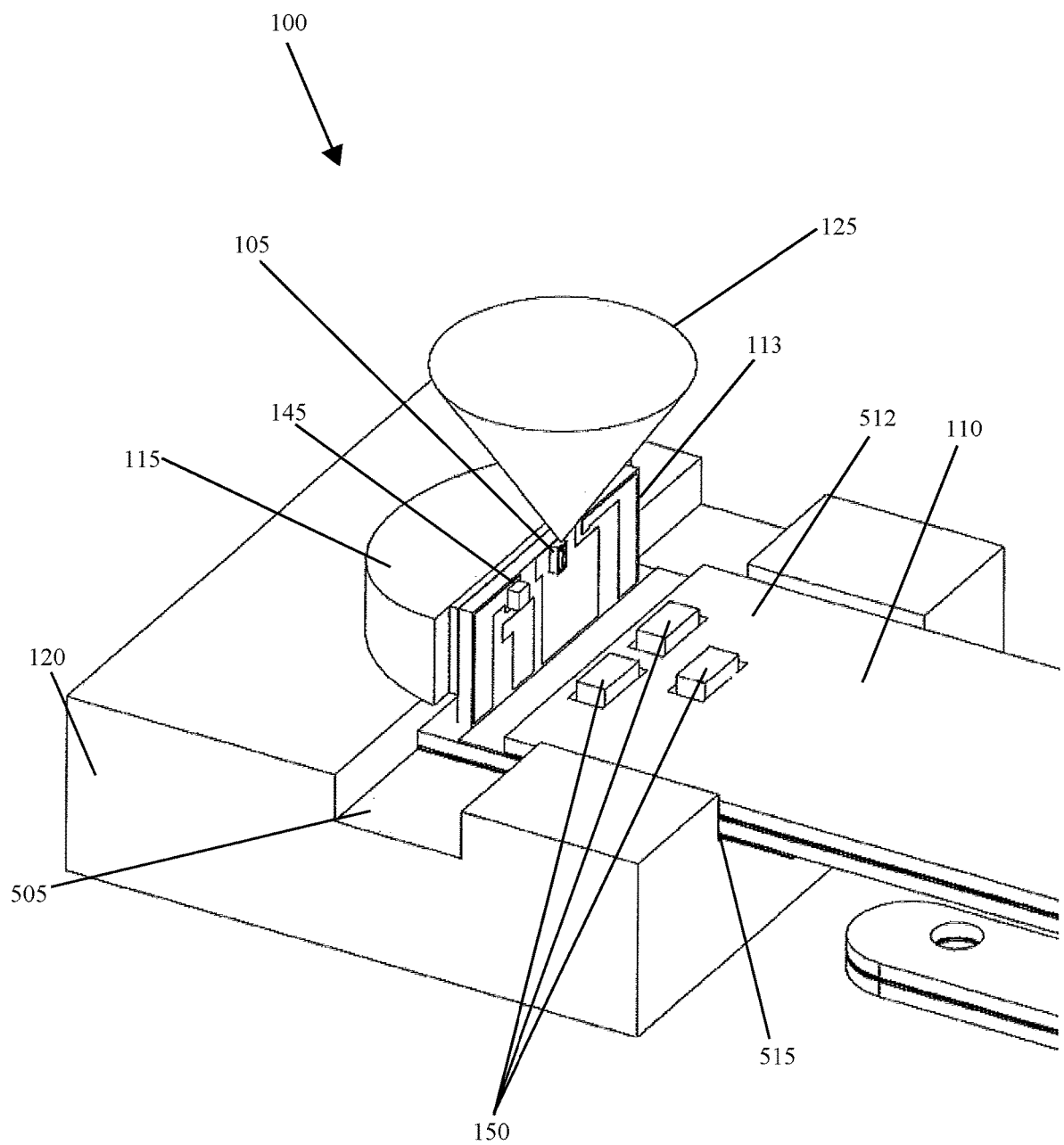
FIG. 7 shows another detail view of example connections between a multi-conductor part and a mounting plate among other features consistent with implementations of the current subject matter.

FIG. 5, FIG. 6, and FIG. 7 show various views illustrating configurations and positioning of the multi-conductor part 110, in particular where the multi-conductor part 110 (e.g., a ribbon cable, some other flexible or rigid conductor, a plurality of individual conductors, etc.) interfaces with the light source module 100 and the mounting plate 113 (e.g., a heat spreader) upon which the light source 105 (e.g., a semiconductor laser chip) is mounted. As shown in FIG. 5, the multi-conductor part 110 can be aligned parallel (or at least approximately parallel) to a surface 505 of the base 120, where the surface 505 faces in a direction aligned with the lens cell axis 132. The support feature 115 may protrude from the surface 505 of the base 120, as shown in FIG. 5. At this orientation, a first surface 510 of the multi-conductor part 110 may optionally rest against a mating surface of the base 120 and/or in a receiving channel 515 formed in the base 120. In other words, the first surface 510 (e.g., a "back" surface) of the multi-conductor part 110 may be in contact with a mating surface of the base 120. In other examples, the mating surface of the base 120 (e.g., the surface of the base 120 that contacts the first surface 510 of the multi-conductor part 110) may be in the receiving channel 515 or other structure that is at least partially recessed relative to the part of the base 120 to which the first end 142 of the sleeve 140 is adhered when the light source module 100 is assembled.

In this manner, the mounting plate 113, which can be secured to the support feature 115 that is part of or otherwise securely and thermally in contact with the base 120, can be oriented at least approximately at a right angle (e.g., a 90° angle) to the surface 505 of the base 120 upon which the multi-conductor part 110 rests (e.g., receiving channel 515) and can thereby also be oriented at least approximately at a right angle to a second surface 512 (opposite to the first surface 510) of the multi-conductor part 110. References to "at least approximately at a right angle" are meant to allow for either or both of the mounting plate 113 and the multi-conductor part 110 to be arranged such that a perfect right angle it not achieved. For example, the surface 505 of the base 120 need not be at exactly a 90° angle to a face of the support feature 115 upon which the mounting plate 113 is supported. Similarly, while it can be advantageous in some implementations of the current subject matter to orient a mounting surface of the support feature 115 on the base 120 at exactly a right angle to the surface 505 of the base 120, such a configuration is not an essential feature of the current subject matter.

FIG. 7 shows a view of a light source module 100 consistent with implementations of the current subject matter in which the lens cell 130 and sleeve 140 have been omitted to better illustrate other components such as the base 120, the support feature 115, the mounting plate 113, the light source 105, the light source temperature sensor 145, the multi-conductor part 110, and the base temperature sensors 150. As shown, radiation 125 may be emitted from the light source 105 in a direction away from the base 120. In the illustrated example of FIG. 7, the radiation 125 is emitted into an expanding beam, which can take the shape of a cone or other three-dimensional shape and need not be rotationally symmetrical.

Figure 8:
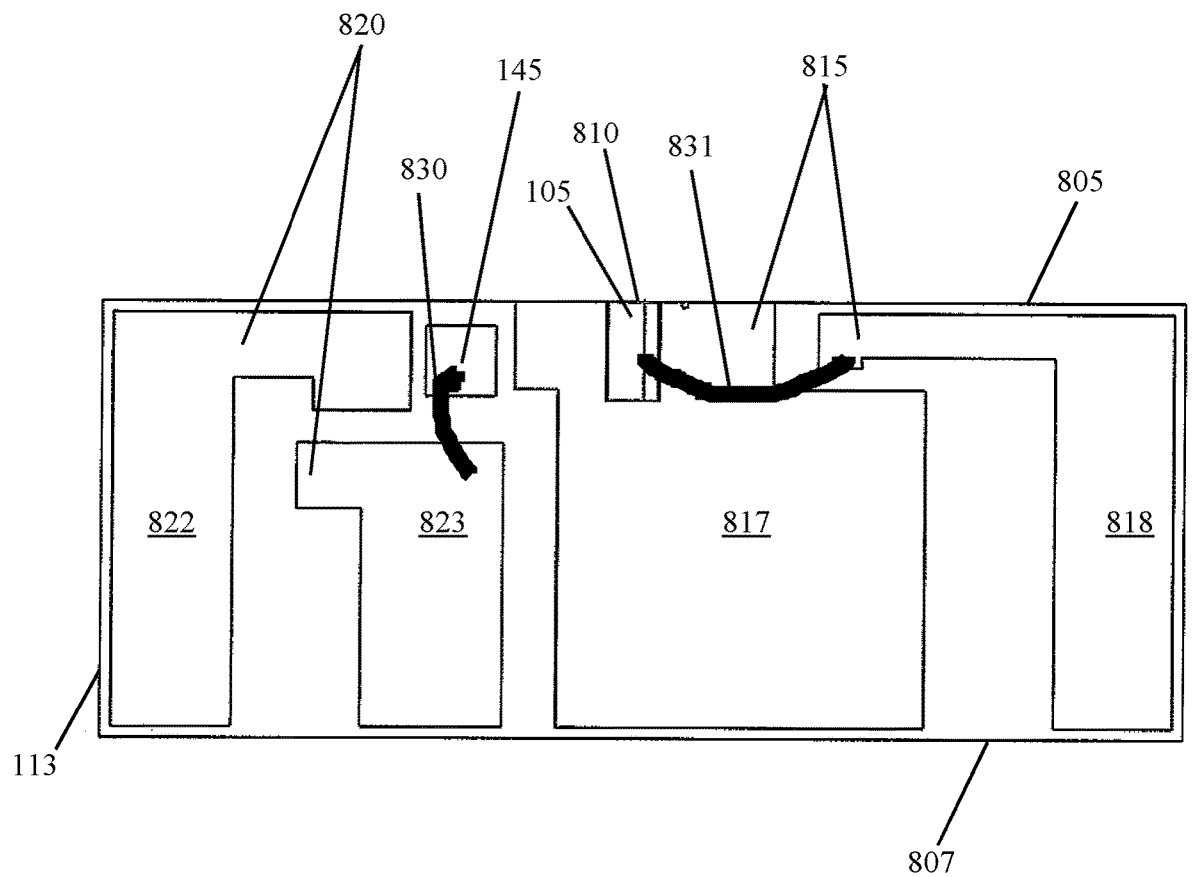
FIG. 8 shows a plan view illustrating an example mounting plate consistent with implementations of the current subject matter.
Figure 9:
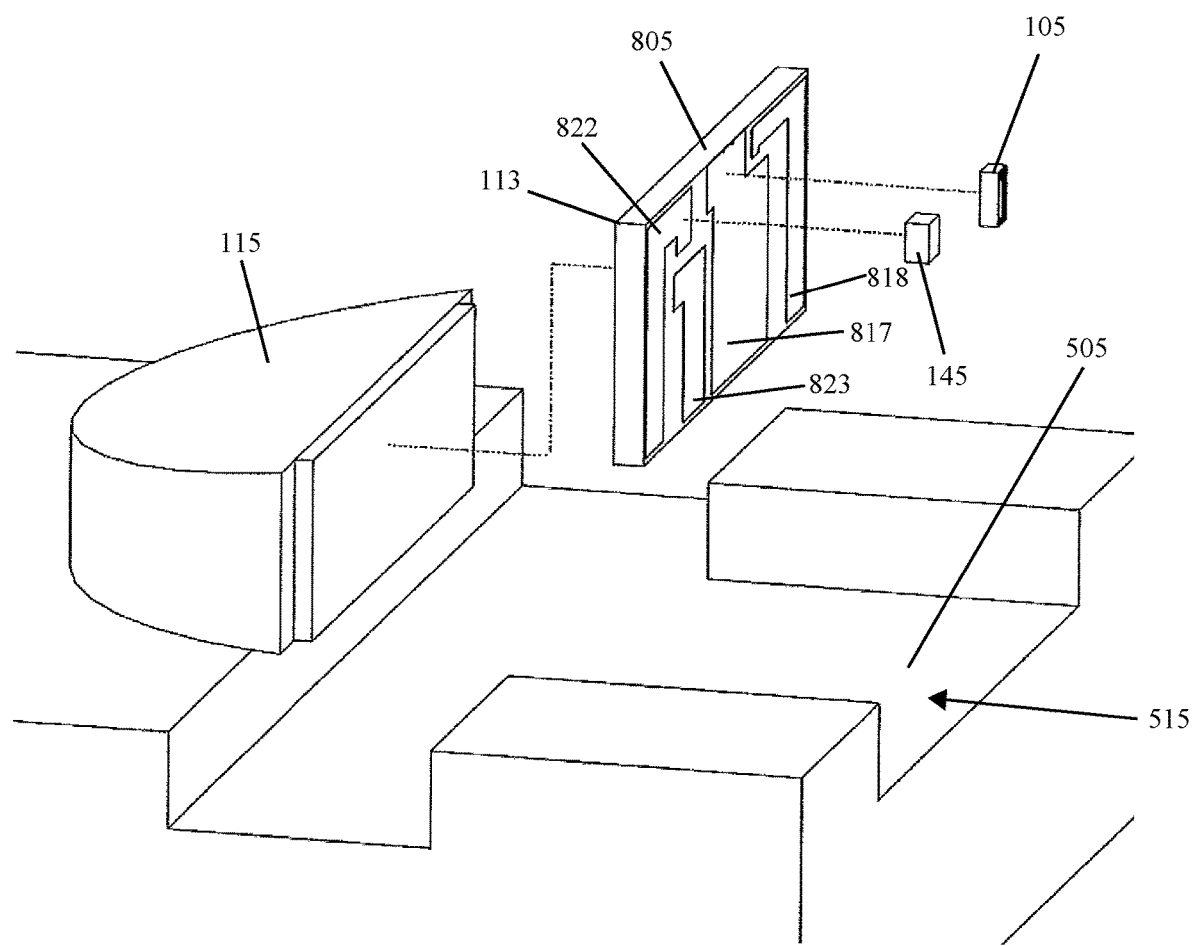
FIG. 9 shows a detail view of an example support feature on a base of a light source module configured for receiving a mounting plate consistent with implementations of the current subject matter.

FIG. 8 shows a plan view of an example mounting plate 113 (e.g., a heat spreader) and FIG. 9 shows an exploded view of the mounting plate 113 and where it may connect to the support feature 115 consistent with implementations of the current subject matter. As shown, the light source 105 and the light source temperature sensor 145 may optionally be disposed at or near a front edge 805 of the mounting plate 113, and an emitting side 810 of the light source 105 may be aligned near the front edge 805 of the mounting plate 113. The front edge 805 may be disposed opposite a back edge 807 of the mounting plate 113, which may be arranged closer to the surface 505 of the base 120 upon which the first surface 510 of the multi-conductor part 110 may be supported (or otherwise in contact therewith). In the example described herein and shown in the included figures, the mounting plate 113 also includes two pairs of conductors, which can in one example include a first pair of conductors 815 for completing a circuit with the light source 105 and a second pair of conductors 820 for completing a circuit with the light source temperature sensor 145. These two circuits can respectively be completed by wire bonds 830, 831, for example as shown in FIG. 8. In an example in which the mounting plate 113 is or includes a ceramic or other electrically insulating heat spreader material, such as for example a heat spreader formed from aluminum nitride or the like, one or both of the conductors in each of the first pair 815 and the second pair 820 of conductors can be metal (or other electrically conductive material) traces deposited on the electrically insulating material of the mounting plate 113 and separated by open area of the electrically insulating mounting plate 113.

The light source 105 can be electrically attached to bridge the two conductors of the first pair of conductors 815, for example by one side of the light source 105 being soldered to a first conductor 817 of the first pair of conductors 815 (particularly if the first pair of conductors 815 includes at least one conductive trace on the mounting plate 113) with a wire bond 831 or other suitable conductive bridge connecting another part of the light source 105 to a second conductor 818 of the first pair of conductors 815. Similarly, the light source temperature sensor 145 can be electrically attached to bridge the two conductors of the second pair of conductors 820, for example by one side of the light source temperature sensor 145 being soldered to a first conductor 822 of the second pair of conductors 820 (particularly if the second pair of conductors 820 includes at least one conductive trace on the mounting plate 113) with a wire bond 830 or other suitable conductive bridge connecting another part of the light source temperature sensor 145 to a second conductor 823 of the second pair of conductors 820.

Referring again at least to FIG. 5, electrical connections 520 between contacts in the multi-conductor part 110 and the first pair of conductors 815 (for completing a circuit with the light source 105) and the second pair of conductors 820 (for completing a circuit with the light source temperature sensor 145) can be formed where the back edge 807 of the mounting plate 113 contacts the multi-conductor part 110. As shown, the back edge 807 is disposed opposite the front edge 805 of the mounting plate near which at least the light source 105 (and optionally also the light source temperature sensor 145) may be connected. In the example described and shown, the mounting plate 113 can be attached to the support feature 115 of the base 120 with sufficient clearance between the back edge 807 of the mounting plate 113 and the surface 505 of the base that supports or otherwise contacts the first surface of the 510 of the multi-conductor part 110 to allow at least part of the multi-conductor part 110 to be disposed between the surface 505 of the base 120 and the back edge 807 of the mounting plate 113. The electrical connections 520 may be any of wire bonds, solder connections, conductive epoxy, or the like. Use of a conductive epoxy or other electrical connection that does not require heating can be advantageous in enabling a very small size of the spectrometer cell 100 without potential complications of excessive soldering steps that may require staged soldering temperatures to avoid damaging bonds during subsequent attachment steps.

The conductors used in the light source module 100 consistent with implementations of the current subject matter may desirably be disposed, for example on the mounting plate 113, such that a sufficient gap of non-conductive material separates each conductor from another conduct. The sufficient gap may be sized such that a failed wire bond or other conductive element of the apparatus cannot fully bridge (or even result in a small enough air gap to result in arcing) across the sufficient gap. The gap size may be selected to provide sufficient additional clearance required for electrical isolation consistent with intrinsic safety explosion standards as well as electrical gap requirements for dissimilar intrinsic safety zones. A further safety benefit of the implementation described above is the reduction in wire bonds to two: one (e.g., the wire bond 831) to connect the light source 105 to the second conductor 818 of the first pair of conductors 815; and a second (e.g., the wire bond 830) to connect the light source temperature sensor 145 to the second conductor 823 of the second pair of conductors 820. Fewer wire bonds can result in fewer potential failure points that need to be controlled to avoid potential accidental bridging of the air gaps needed to maintain intrinsic safety. The thickness of the mounting plate 113 (which as noted above is preferably made of a thermally conductive but electrically insulating material) may be chosen to provide a necessary insulating gap between the support feature 115 and the conductive traces 815, 820 on the surface of the mounting plate 113. For example, the thickness of the mounting plate 113 may be sufficiently large to prevent any chance of contact with a failed (e.g., at least partially detached) wire bond 830, 831, which may be capable of causing an arc between other conductors on the surface of the mounting plate 113 and the support feature 115.

Figure 10:
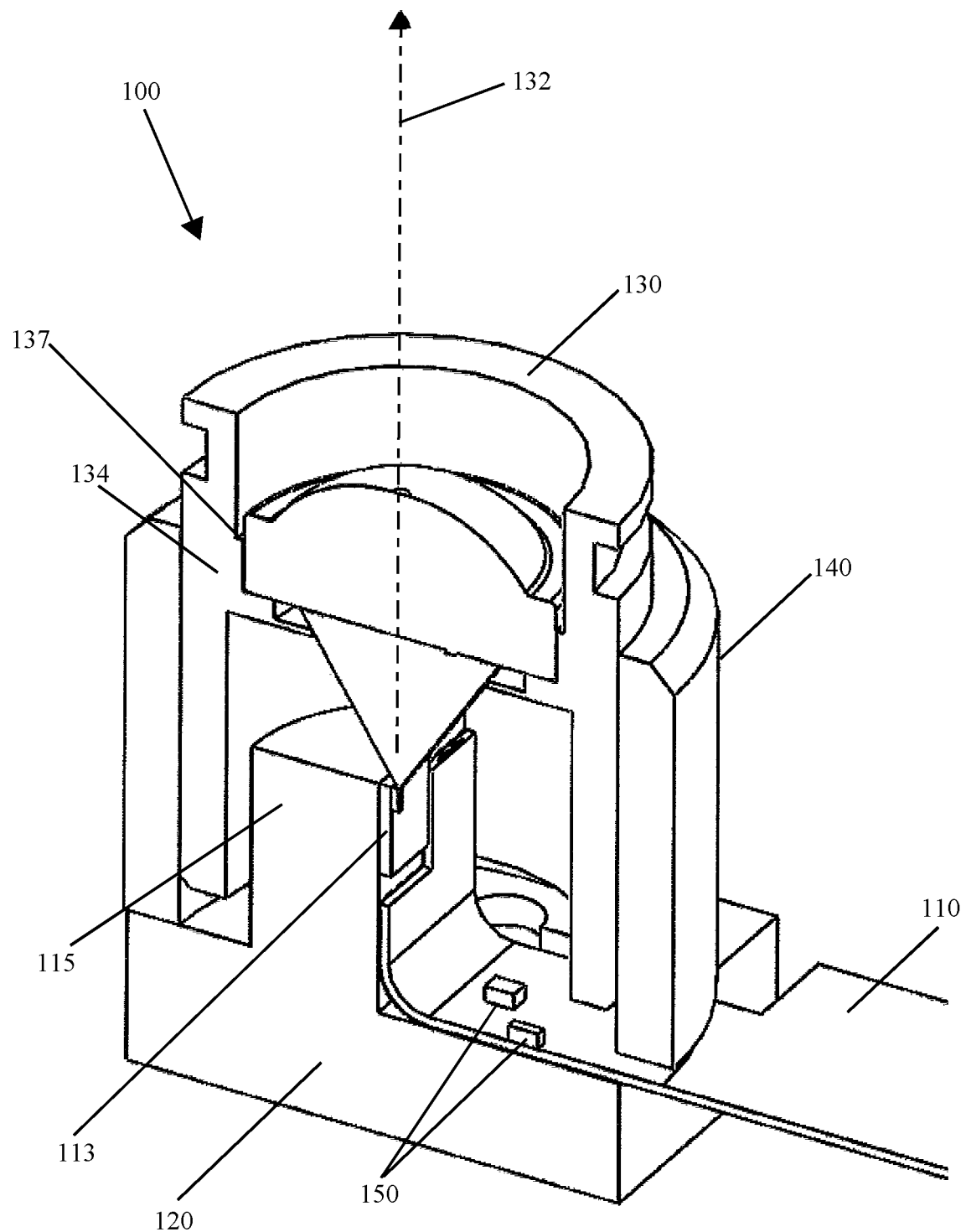
FIG. 10 and FIG. 11 show views illustrating example features of an alternative light source module configuration consistent with implementations of the current subject matter.
Figure 11:
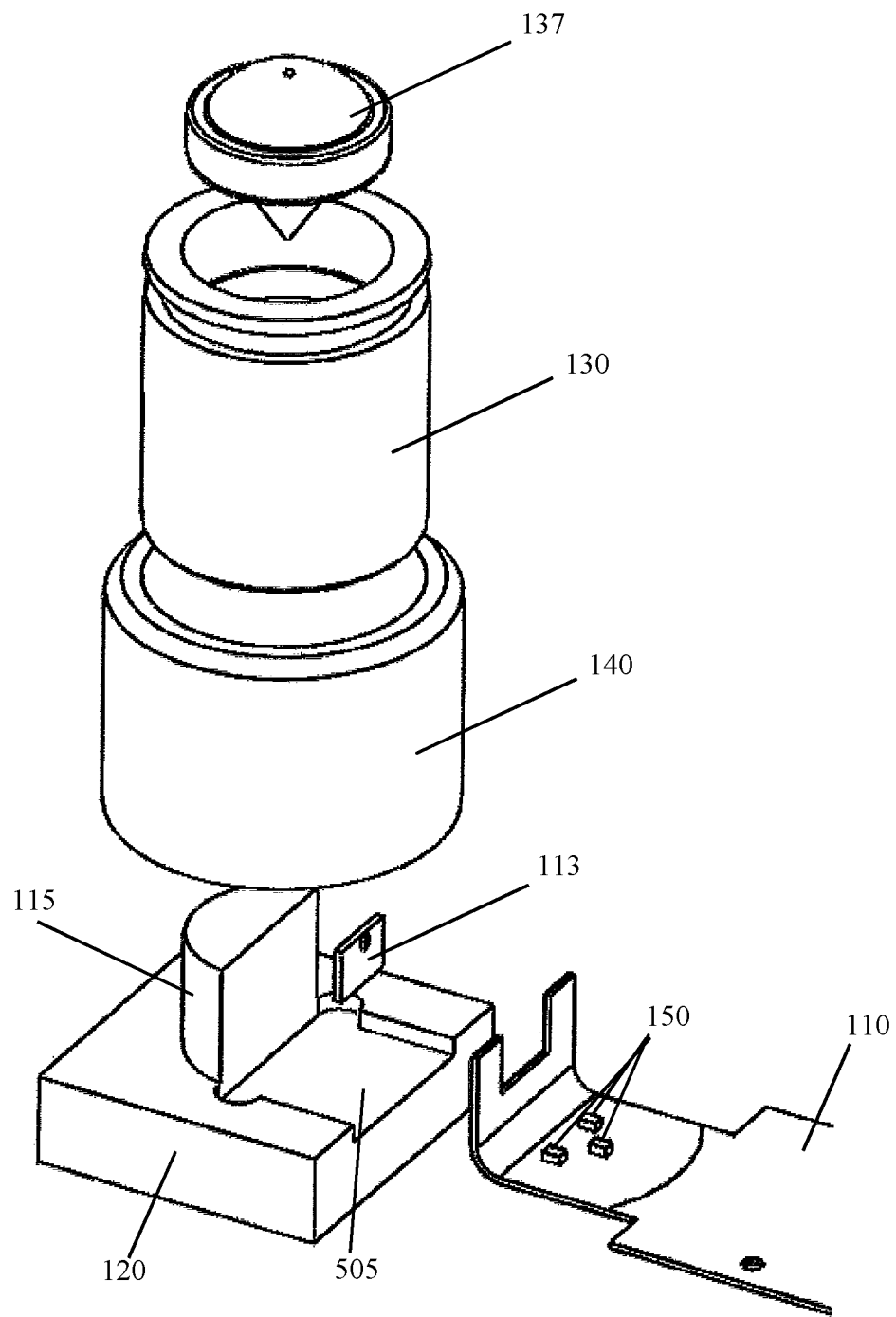

FIG. 10 and FIG. 11 show another example of a light source module 100 consistent with implementations of the current subject matter. In this example, the multi-conductor part 110 may approach the base 120 at a similar orientation to what is described above and shown in FIG. 1 to FIG. 9. However, the multi-conductor part 110 can make a bend to reorient at least approximately parallel to the support feature 115 and the mounting plate 113 secured to the support feature 115. Contacts in the multi-conductor part 110 may then linearly connect to conductors or other attachment means for completing circuits with the light source 105 and/or the light source temperature sensor 145 on the mounting plate 113. Such an implementation enables another configuration for providing electrical connections from a controller and/or power source to the light source 105 and/or various light source temperature sensors 145 and/or base temperature sensors 150 within the scope of the current subject matter. It will be understood that other, non-described configurations are also within the current scope.

Figure 12:
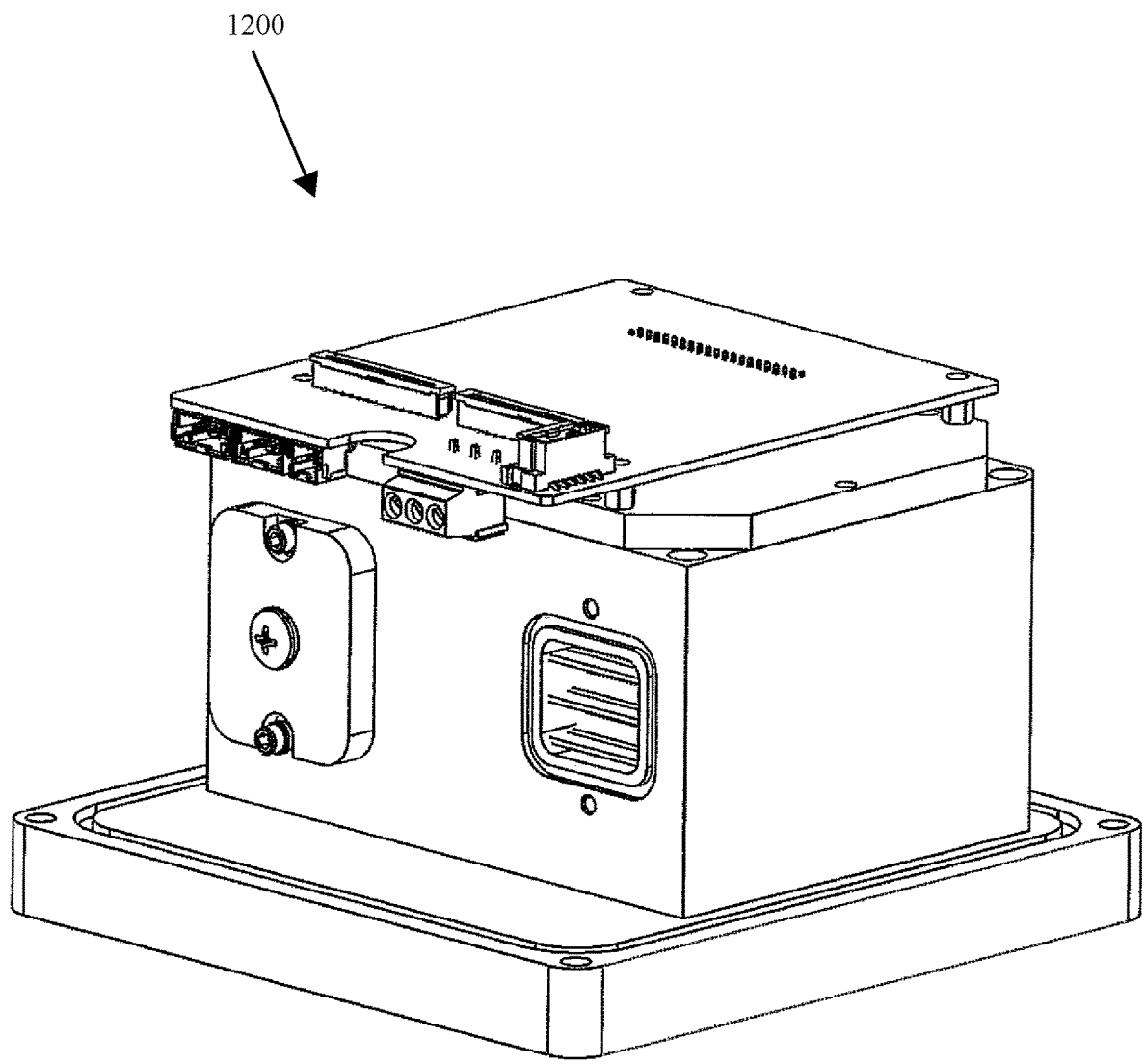
FIG. 12, FIG. 13, and FIG. 14 show views of a spectrometer system into which a light source module consistent with implementations of the current subject matter can be incorporated.
Figure 13:
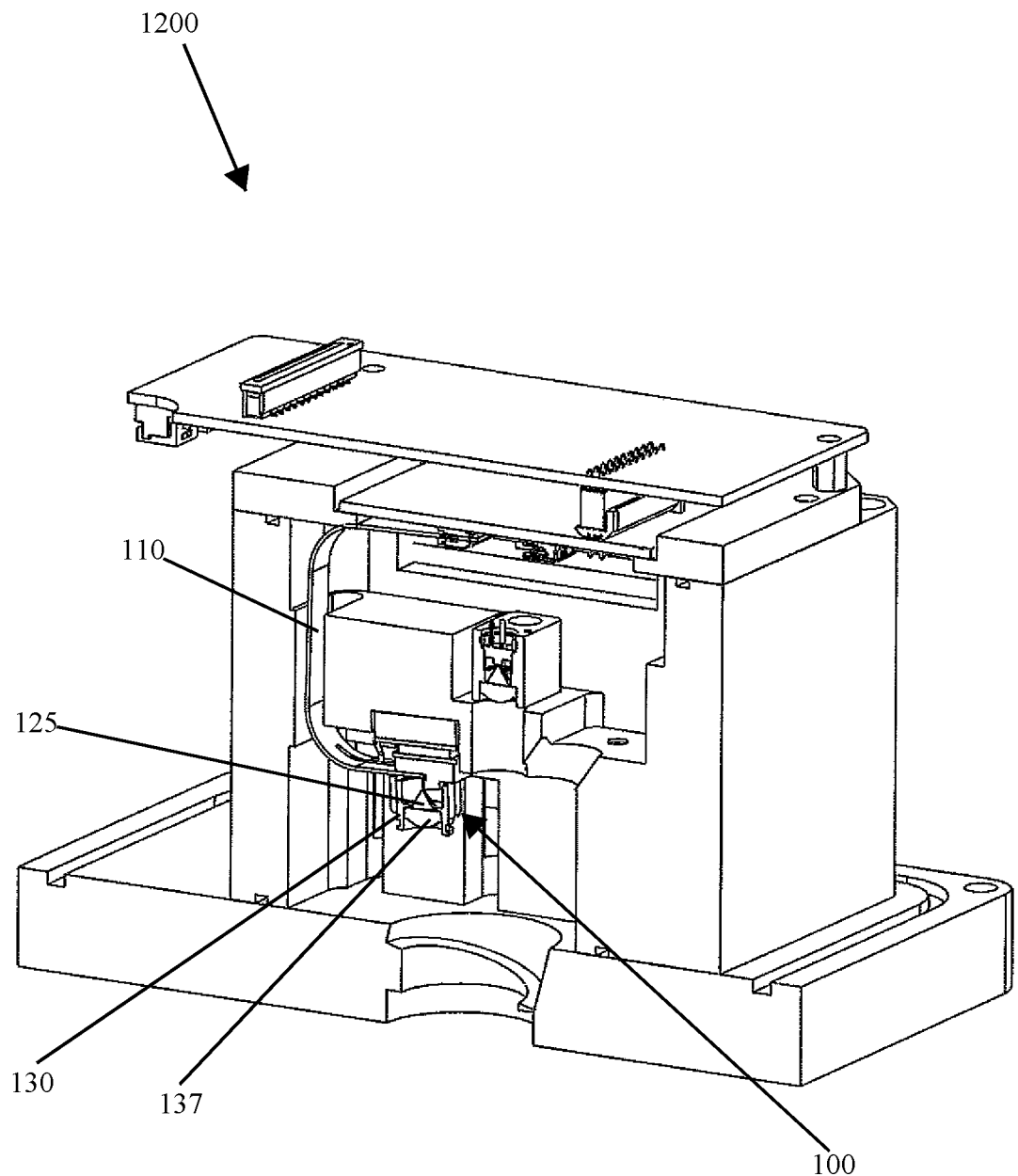
Figure 14:
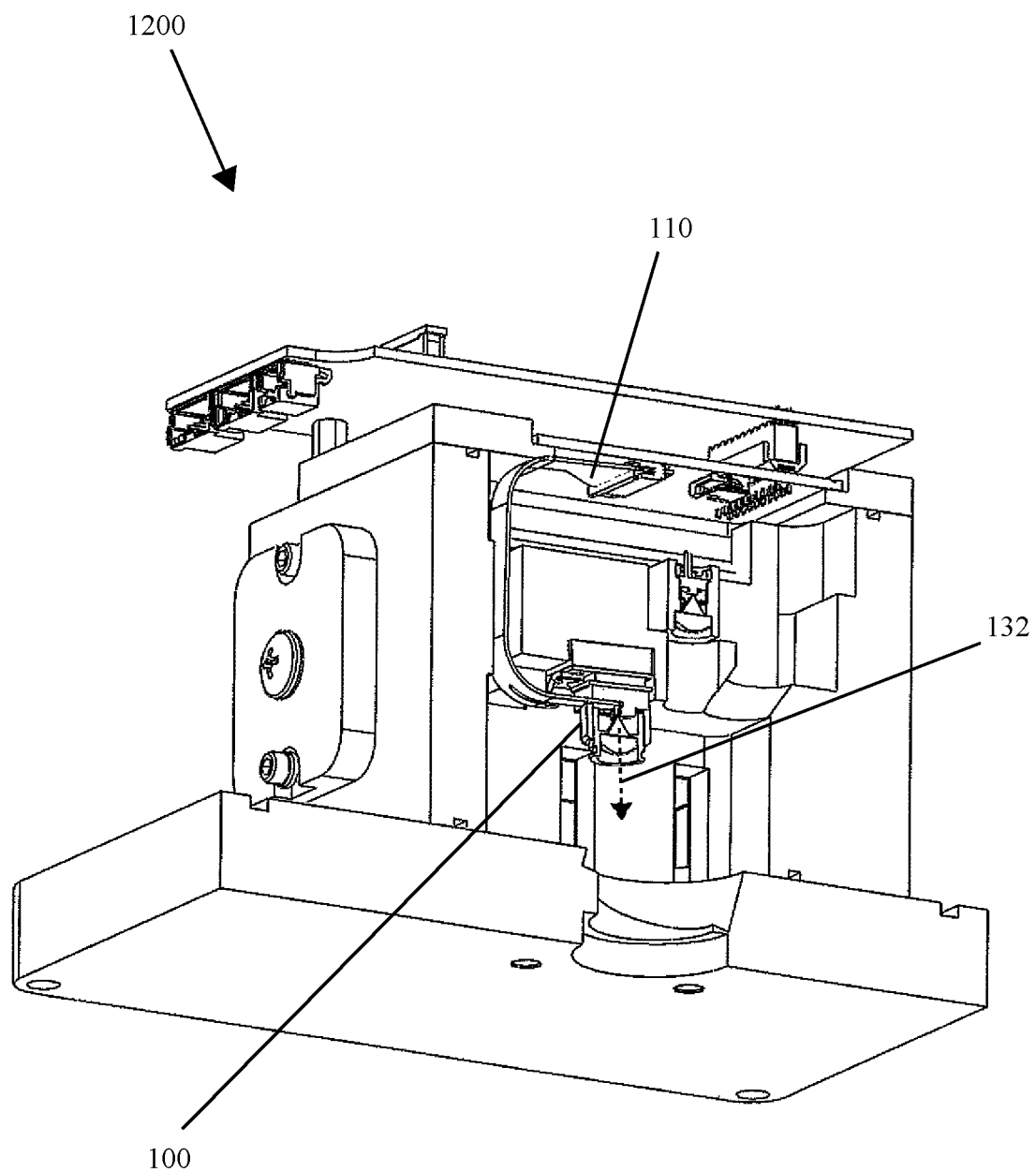

As shown in FIG. 12, FIG. 13 and FIG. 14, the light source module 100 may be mounted on or within, or otherwise incorporated into, an optical head of a spectrometer system 1200. FIG. 12 shows an external view of the spectrometer system 1200 while FIG. 13 and FIG. 14 show partial cutaway views from an upper perspective and a lower perspective, respectively. As noted above, the spectrometer system 1200 may also include a sample cell (not shown) into which radiation 125 emitted by the light source 105 and passing through the lens 137 is directed. The relative orientations of the light source 105, lens cell 130, lens 137, and a beam path through the sample cell into which the radiation 125 emitted by the light source 105 is directed may advantageously be along the axis of the lens cell 130 and the radiation 125. As noted above, this configuration may minimize the effects of thermal expansion on misalignment of optical components of the spectrometer system 1200. In some applications of the light source module 105, the sample cell may further include a mirror (not shown) at an opposite end of the sample cell 1205 from the light source module 100 such that a beam path is reflected at least once before reaching a detector (not shown). In some implementations of the current subject matter, the detector may be part of the light source module 100. In other implementations of the current subject matter, the detector may be part of a detector module (not shown in the drawings) separate from the light source module 100. In various implementations of the current subject matter, a detector module may be positioned at an opposite end of the sample cell from the light source module, at a same end of the sample cell as the light source module 100, or at some other location.

Attachment of the light source module 100 to other components of the spectrometer system 1200 can be accomplished using one or more attachment approaches capable of proving a fixed and reproducible spatial arrangement (e.g., position, orientation, pitch, etc.) between components. In some examples, a set of fixed pins or other rigid connection guides can be included such that the light source module 100, assembled as described herein and manufactured (e.g., machined) to appropriate tolerances, can be repeatably inserted into and removed from a spectrometer system 1200 without requiring re-alignment of the various pieces. As noted herein, the light source module 100 may be constructed consistent with the current subject matter to have the light source 105 fixed at a desired focal distance from the lens 137 with no other parts that may be prone to being displaced or experience relative movement. Having a fixed and repeatable locking mechanism for holding the light source module 100 in the spectrometer system 1200 may provide benefits including allowing of swapping of one light source module 100 for another or for cleaning or other service before replacing the same light source module 100 in the spectrometer system 1200 without a need for complicated alignment procedures.

Figure 15:
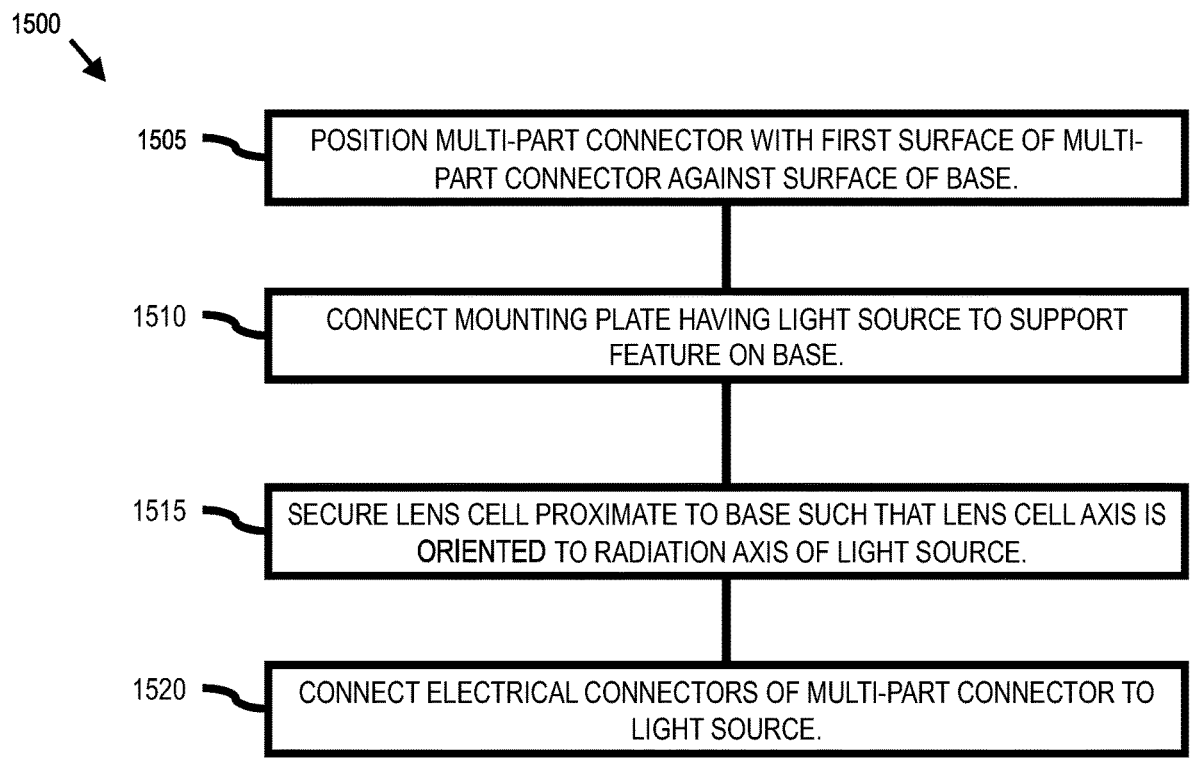
FIG. 15 shows a process flow diagram illustrating aspects of a method having one or more features consistent with implementations of the current subject matter.

A method for assembling the light source module 100 consistent with implementations of the current subject matter can include one or more of the following features. As illustrated in the process flow chart 1500 of FIG. 15, at a step 1505 a multi-conductor part 110 is positioned with a first surface of the multi-conductor part 110 against a surface 505 of a base 120. The base further includes a support feature 115.

At 1510 a mounting plate 113 is connected to the support feature 115. The mounting plate 113 includes a light source 105 attached to it. The light source can be oriented such that radiation emitted from the light source 105 is directed along a radiation axis and in a direction that is away from the surface 505 of the base 120.

A lens cell 130 having a lens 137 attached inside is secured proximate to the surface 505 of the base at 1515. The lens cell 130 may optionally be rotationally symmetric about a lens cell axis 132. The lens cell axis 132 may be oriented relative to the radiation axis as discussed above. The securing of the lens cell 130 proximate to the surface 505 of the base 120 may optionally include a sleeve 140 being attached to the base 120 at a first end of the sleeve 140 and the lens cell 130 being attached within the sleeve 140 and positioned at a distance from the base 120 to provide a desired focal length of the radiation 125 from the light source to the lens 137. These two processes may be performed concurrently or successively such that all of the adhesive bonds may undergo radiation-aided curing at a same time or in sequence.

Consistent with some implementations of the current subject matter, this securing process may include use of an adhesive that cures by either or both of radiation (optionally ultraviolet radiation) and heat. Using such an approach the adhesive may be applied between an outer surface of the lens cell 130 and an inner surface of the sleeve 140 and also between an end of the sleeve 140 and the base 120. The combination of the lens cell 130 and the sleeve 140 may be translated relative to the base 120 to achieve a desired alignment of the two assemblies in the x- and y-dimensions, where these dimensions are parallel to an upper surface of the base 120. Extension or retraction of the lens cell 130 relative to the sleeve can be performed to locate the lens 137 at a position in the z-dimension, which is perpendicular to the x- and y-dimensions, at a proper focal distance from the light source 105. This distance can optionally be checked by causing radiation 125 to be emitted by the light source and testing focus of the radiation to determine a preferred location for the lens cell 130 (and lens 137) relative to the sleeve 140 and the light source 105 affixed (at least indirectly) to the base 120.

UV-curing adhesive (or optionally some other adhesive or affixing material that may be quickly cured when the lens cell 130, sleeve 140, and base 120 are in the proper relative positions and alignment) may then be cured, optionally by passing the curing light through at least part of the sleeve 140, which may be constructed of a UV transmissive material, to hold the assembly in its determined position. In other words, a first end of the sleeve 140 may be attached to the base 120 by a UV-curing adhesive or by other means, and the method may include applying a UV cure to the adhesive. Similarly, the lens cell 130 may be secured within the sleeve 140 by a same or a different UV-curing adhesive or by other means, and the method may include applying a UV cure to the adhesive, optionally by passing the curing light through at least part of the sleeve 140.

Electrical connectors of the multi-conductor part 110 are connected to the light source 105 at 1520. The electrical connectors are configured to connect to a controller to allow the controller to provide current and/or control signals to the light source 105. The connecting of the electrical connectors of the multi-conductor part 110 to the light source 105 may optionally include the mounting plate 113 being secured to the support feature 115 to form an approximately right angle with the multi-conductor part 110 and a plurality of conductors of the mounting plate 113 being connected to the electrical connectors of the multi-conductor part 110.

In further aspects, the method can include connecting additional electrical connectors of the multi-conductor part 110 to a light source temperature sensor 145. The additional electrical connectors are configured to connect to the controller to enable the controller to read signals from the light source temperature sensor 145. Temperature controller electrical connections of the multi-part connector 110 may also be connected to a temperature or heat control device 305, which may be thermally contacted to the base 120, which can be constructed of a thermally conductive material.

Figure 16:
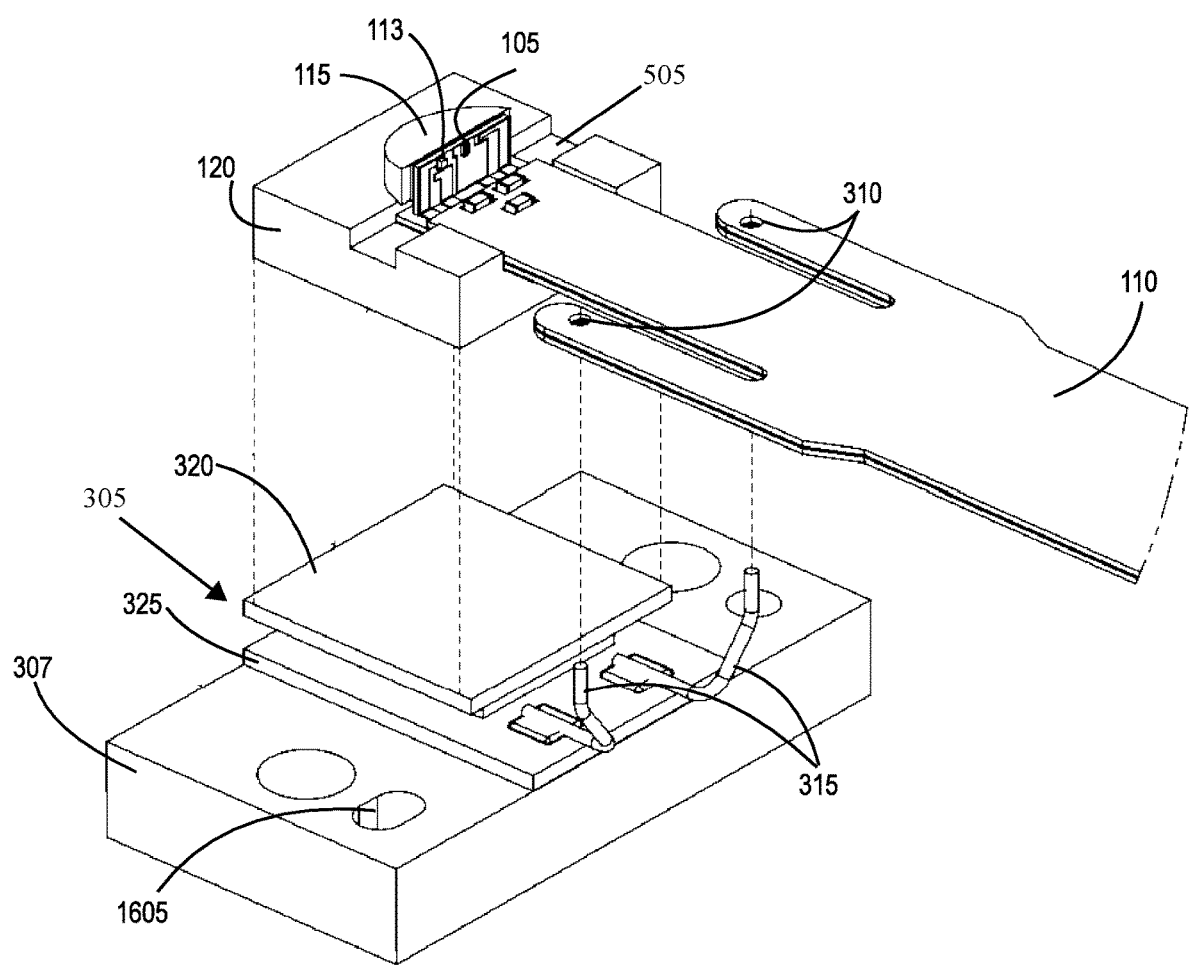
FIG. 16 and FIG. 17 show features of an assembly process for a light source module consistent with implementations of the current subject matter.
Figure 17:
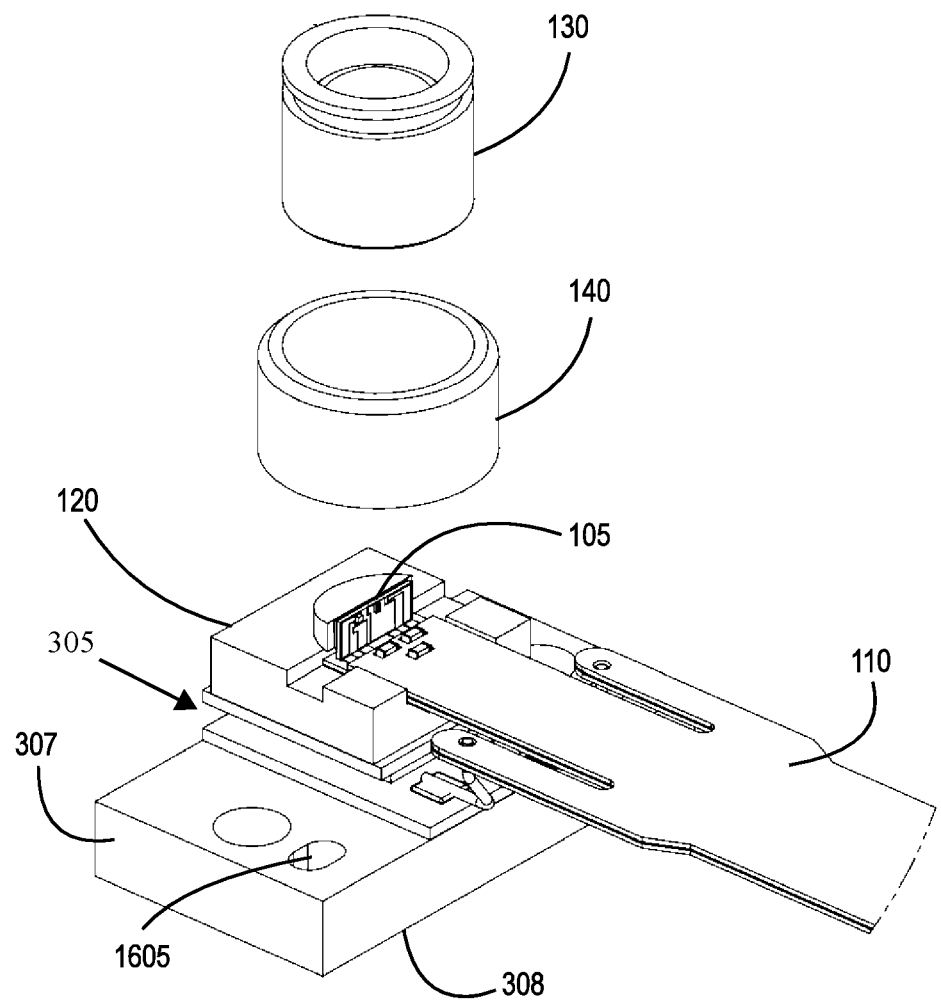

FIG. 16 and FIG. 17 show successive views of the light source module 100 consistent with implementations of the current subject matter in various stages of assembly. In FIG. 16, an assembly including the multi-conductor part 110 attached to the base 120 with the mounting plate 113 having the light source 105 attached to the support feature 115 is mounted (on a side opposite the surface 505 to which the multi-conductor part 110 is attached) onto the cold side 320 of the heat or temperature control device 305 and the leads 310 of the multi-conductor part 110 are attached by wire leads 315 to the heat or temperature control device 305. The hot plate 307 secured to the hot side 325 of the heat or temperature control device 305 includes one or more mechanical joining and registration features 1605 for connecting to a spectrometer. The base 120 is aligned onto the cold side 320 of the heat or temperature control device 305 within a set of positioning tolerances relative to the mechanical joining and registration features 1605.

FIG. 17 shows the assembly of the lens cell 130 and sleeve 140 onto the base 120, which has been assembled to the heat or temperature control device 305 affixed on an opposing side to the hot plate 307. The sleeve 140 and lens cell 130 may be translated in the x and y directions (where the "z" direction is orthogonal to the surface of the base 120 and the opposed mating surface 308 of the hot plate 307). The positioning and alignment of the beam emitted by the light source 105 can be checked during assembly of the sleeve 140 and lens cell 130 such that beam angle, polarity, position, etc. are established within a very tight tolerance relative to the mechanical joining and registration features 1605 of the hot plate 307.

In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together." Use of the term "based on," above and in the claims is intended to mean, "based at least in part on," such that an unrecited feature or element is also permissible.

The implementations set forth in the foregoing description do not represent all implementations consistent with the subject matter described herein. Instead, they are merely some examples consistent with aspects related to the described subject matter. Although a few variations have been described in detail herein, other modifications or additions are possible. In particular, further features and/or variations can be provided in addition to those set forth herein. For example, the implementations described above can be directed to various combinations and sub-combinations of the disclosed features and/or combinations and sub-combinations of one or more features further to those disclosed herein. In addition, the logic flows depicted in the accompanying figures and/or described herein do not necessarily require the particular order shown, or sequential order, to achieve desirable results. The scope of the following claims may include other implementations or embodiments.

The invention claimed is:

1. A method for assembling a light source module, the method comprising:
   positioning a multi-conductor part relative to a base to provide a plurality of electrical conductors, wherein the base includes a surface and a support feature protruding from the surface, the multi-conductor part including the plurality of electrical conductors and a base temperature sensor that contacts the base, the base temperature sensor being electrically connected to at least one of the plurality of electrical conductors;
   connecting a mounting plate to the support feature, the mounting plate having a light source attached thereto, the light source being oriented such that radiation emitted from the light source is directed away from the surface of the base, the light source including a semiconductor laser;
   mounting a side of the base opposite the surface to a cold side of a heat or temperature control device, wherein an opposing hot side of the heat or temperature control device is mounted to a hot plate;
   securing a lens cell proximate to the surface of the base, the lens cell having a lens attached therein, wherein the securing includes positioning and orienting the lens cell relative to the radiation emitted from the light source, wherein the securing of the lens cell includes:
      attaching a sleeve, which at least partially surrounds at least part of the lens cell, to the surface of the base at an end surface of the sleeve;
      positioning and securing the lens cell within the sleeve at a focal distance from the base as to provide a desired focal length of the radiation from the light source to the lens;
      securing the lens cell within the sleeve and the sleeve to the surface of the base by an adhesive that is composed to be cured by both curing radiation and heat, wherein the adhesive is applied between the outer surface of the lens cell and an inner surface of the sleeve and between the end surface of the sleeve and the surface of the base, and wherein the sleeve includes a material that is transmissive to the curing radiation; and
   further connecting the at least one of the plurality of electrical conductors that is electrically connected to the base temperature sensor to an optical ignition safety protection system configured to interrupt current to the light source if the base temperature sensor indicates that a temperature of the light source is outside of a safe range.

2. The method of claim 1, wherein the base temperature sensor is a first base temperature sensor of a plurality of base temperature sensors, each configured to provide signals to the optical ignition safety protection system, which is configured to interrupt current to the light source when any of the signals from the plurality of base temperature sensors indicate that the temperature of the light source is outside of the safe range.

3. The method of claim 1, wherein the lens cell is rotationally symmetric about a lens cell axis.

4. The method of claim 1, further comprising:
   translating the combination of the lens cell and the sleeve relative to the base to achieve a desired alignment of the lens of the lens cell and the base in the x- and y-dimensions, where the x- and y-dimensions are parallel to an upper surface of the base; and
   performing an extension or retraction of the lens cell relative to the sleeve as to locate the lens at a position in the z-dimension, which is perpendicular to the x- and y-dimensions, at the focal distance from the light source.

5. The method of claim 4, further comprising checking the focal distance, wherein the checking includes causing radiation to be emitted by the light source and testing focus of the radiation to determine a preferred location for the lens cell and lens relative to the sleeve and the light source.

6. The method of claim 5, further comprising first curing the adhesive, the first curing including passing the curing radiation through at least part of the sleeve and later second curing the adhesive by another technique.

7. The method of claim 6, wherein the second curing the adhesive is performed using heat.

8. The method of claim 6, wherein the first curing only partially cures the adhesive.

9. The method of claim 1, wherein the hot plate includes one or more mechanical joining and registration features, and the securing of the lens cell proximate to the surface of the base further includes establishing a beam angle, a polarity and a position of the radiation emitted from the light source within a set of tolerances relative to the mechanical joining and registration features.

10. The method of claim 1, wherein the connecting of the mounting plate to the support feature includes making electrical connections between the electrical conductors in the multi-conductor part and conductive elements on the mounting plate, wherein the mounting plate and the multi-conductor part join at an approximately right angle.

11. A light source module comprising:
   a base including a thermally conducting material and having a surface;
   a support feature thermally connected to the base and protruding from the surface;
   a mounting plate attached to the support feature, the mounting plate having attached thereto a light source, the light source being aligned on the mounting plate as attached to the support structure to direct radiation along a radiation axis directed away from the surface of the base, the light source including a semiconductor laser;

a lens cell having a rotationally symmetric shape and a lens support upon which a lens is supported, the lens cell secured in a lens cell position proximate the surface of the base such that the radiation axis passes through the lens supported on the lens support;

a sleeve at least partially encircling the lens cell, the sleeve having an end surface that contacts and is secure to the surface of the base, wherein the sleeve is secured to the lens cell such that an outer surface of the lens cell is secured to an inner surface of the sleeve, wherein the lens cell is secured within the sleeve and the sleeve is secured to the surface of the base by an adhesive that is composed to be cured by both curing radiation and heat, wherein the adhesive is disposed between the outer surface of the lens cell and the inner surface of the sleeve and between the end surface of the sleeve and the surface of the base, wherein the sleeve includes a material that is transmissive to the curing radiation, and wherein the lens cell is positioned and held within the sleeve by the adhesive at a focal distance from the base as to provide a desired focal length of the radiation from the light source to the lens; and a multi-conductor part including a plurality of electrical conductors that provide a plurality of electrical connections to a plurality of conductive elements on the mounting plate, the multi-conductor part further including a base temperature sensor configured to provide signals to an optical ignition safety protection system configured to interrupt current to the light source when the signals from the base temperature sensor indicate that a temperature of the light source is outside of a safe range.

12. The light source module of claim 11, wherein the base temperature sensor is a first base temperature sensor of a plurality of base temperature sensors, each configured to provide signals to the optical ignition safety protection system, which is configured to interrupt current to the light source when any of the signals from the plurality of base temperature sensors indicate that the temperature of the light source is outside of the safe range.

13. The light source module of claim 11, wherein the mounting plate and the multi-conductor part join at an approximately right angle.

14. The light source module of claim 11, wherein the lens cell is rotationally symmetric about a lens cell axis.

15. The light source module of claim 11, further comprising a heat or temperature control device having a cold side in thermal communication with a side of the base opposite to the surface.

16. The light source module of claim 15, wherein an opposing hot side of the heat or temperature control device is mounted to a hot plate.

17. The light source module of claim 16, wherein the hot plate includes one or more mechanical joining and registration features, and wherein the securing of the lens cell proximate to the surface of the base further comprises establishing a beam angle, a polarity and a position of the radiation emitted from the light source within a set of tolerances relative to the mechanical joining and registration features.

* * * * *